(12) United States Patent
Kim et al.

(10) Patent No.: US 12,342,531 B2
(45) Date of Patent: Jun. 24, 2025

(54) INTEGRATED CIRCUIT DEVICE

(71) Applicant: Samsung Electronics Co., Ltd., Suwon-si (KR)

(72) Inventors: Suncheul Kim, Hwaseong-si (KR); Youngsang Lee, Hwaseong-si (KR); Yunchul Shin, Seongnam-si (KR); Donghoon Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 424 days.

(21) Appl. No.: 17/734,436

(22) Filed: May 2, 2022

(65) Prior Publication Data

US 2022/0384450 A1 Dec. 1, 2022

(30) Foreign Application Priority Data

May 25, 2021 (KR) .......................... 10-2021-0066825

(51) Int. Cl.
*H10B 12/00* (2023.01)

(52) U.S. Cl.
CPC ........... *H10B 12/34* (2023.02); *H10B 12/053* (2023.02)

(58) Field of Classification Search
None
See application file for complete search history.

(56) References Cited

U.S. PATENT DOCUMENTS

| | | | |
|---|---|---|---|
| 6,893,948 B2 | 5/2005 | Ballantine et al. | |
| 7,205,601 B2 | 4/2007 | Lee et al. | |
| 9,449,830 B2 | 9/2016 | Kang | |
| 9,837,423 B2 | 12/2017 | Oh et al. | |
| 10,553,590 B2 | 2/2020 | Kim | |
| 11,121,025 B2 | 9/2021 | Hsu et al. | |
| 11,251,302 B2 | 2/2022 | Jambunathan et al. | |
| 2012/0153381 A1 | 6/2012 | Song | |
| 2012/0326314 A1 | 12/2012 | Brown et al. | |
| 2018/0174845 A1* | 6/2018 | Jang | ..................... H01L 29/4966 |
| 2018/0342518 A1* | 11/2018 | Kim | ....................... H01L 29/513 |

(Continued)

FOREIGN PATENT DOCUMENTS

| | | |
|---|---|---|
| JP | 2011-243948 A | 12/2011 |
| JP | 2014-038960 A | 2/2014 |
| KR | 10-2010-0077617 A | 7/2010 |

(Continued)

OTHER PUBLICATIONS

Taiwanese Decision to Refuse dated Apr. 26, 2023 issued in corresponding Taiwanese Patent Application No. 111118299.

(Continued)

*Primary Examiner* — Hsien Ming Lee

(74) *Attorney, Agent, or Firm* — Harness, Dickey & Pierce, P.L.C.

(57) ABSTRACT

An integrated circuit device includes a substrate including an active region defined by a device isolation layer, the substrate defining a gate trench extending across the active region, a gate dielectric layer conformally covering an inner surface of the gate trench, and a gate electrode filling the gate trench on the gate dielectric layer. The gate electrode is composed of crystal grains of a single metal, and a diagonal length of at least one of the crystal grains is greater than a height of the active region that is in contact with the gate electrode.

20 Claims, 25 Drawing Sheets

(56) References Cited

U.S. PATENT DOCUMENTS

2020/0144271 A1    5/2020  Kim

FOREIGN PATENT DOCUMENTS

| KR | 10-2012-0066776 A | 6/2012 |
| KR | 2018-0130189 A | 12/2018 |
| TW | 201643945 A | 12/2016 |
| TW | 201924065 A | 6/2019 |
| TW | 202013503 A | 4/2020 |

OTHER PUBLICATIONS

Taiwanese Office Action dated Dec. 29, 2022 issued in Taiwanese Patent Application No. 111118299.
Korean Office Action dated Apr. 27, 2025 for corresponding Korean Application No. 10-2021-066825.

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2021-0066825, filed on May 25, 2021, in the Korean Intellectual Property Office, the disclosure of which is incorporated by reference herein in its entirety.

BACKGROUND

Inventive concepts relates to an integrated circuit device, and more particularly, to an integrated circuit device including a buried channel array transistor (BCAT).

Recently, as the degree of integration of an integrated circuit device has been gradually increased, a structure of an integrated circuit device including a BCAT having a plurality of word lines buried in a substrate has been proposed. Accordingly, various studies are being conducted to improve and stabilize an operation and reliability of the BCAT.

SUMMARY

Inventive concepts provides an integrated circuit device including a buried channel array transistor to improve electrical characteristics by adjusting a grain size of a metal material constituting a gate electrode.

Additional aspects will be set forth in part in the description which follows and, in part, will be apparent from the description, or may be learned by practice of example embodiments of the disclosure.

According to some example embodiments, an integrated circuit device includes a substrate including an active region defined by a device isolation layer, the substrate defining a gate trench extending across the active region, a gate dielectric layer conformally covering an inner surface of the gate trench, and a gate electrode filling the gate trench on the gate dielectric layer. The gate electrode is composed of crystal grains of a single metal, and a diagonal length of at least one of the crystal grains is greater than a height of the active region that is in contact with the gate electrode.

According to some example embodiments, an integrated circuit device includes a substrate including an active region defined by a device isolation layer, the substrate defining a gate trench extending across the active region, a gate dielectric layer conformally covering an inner surface of the gate trench, and a gate electrode filling the gate trench on the gate dielectric layer. The gate electrode is composed of crystal grains of a single metal, and the gate electrode comprises first crystal grains filling the gate trench, and second crystal grains between the first crystal grains and the gate dielectric layer, at least one of the second crystal grains smaller in grain size than at least one of the first crystal grains.

According to some example embodiments, an integrated circuit device includes a substrate including an active region defined by a device isolation layer, a gate structure crossing the active region and buried in the substrate, and source/drain regions on both sides of the gate structure. The gate structure is defined by a gate trench in the substrate, the gate structure including a gate dielectric layer conformal on an inner wall of the gate trench, a gate barrier layer conformal on the gate dielectric layer in a lower region of the gate trench, a gate electrode on the gate barrier layer and filling the lower region of the gate trench, and a capping insulation layer on the gate electrode to fill an upper region of the gate trench. The gate electrode is composed of crystal grains of a single metal. The gate electrode comprises first crystal grains filling the gate trench, and second crystal grains between the first crystal grains and the gate dielectric layer, at least one of the second grains having a diagonal length less than a diagonal length of at least one of the first crystal grains. The diagonal length of the at least one of the first crystal grains is greater than a height a top surface of the active region exposed from the device isolation layer and a horizontal width of the top surface of the active region exposed from the device isolation layer.

BRIEF DESCRIPTION OF THE DRAWINGS

Some example embodiments of inventive concepts will be more clearly understood from the following detailed description taken in conjunction with the accompanying drawings in which:

FIGS. 5A and 5B together show a device isolation trench defining a plurality of active regions may be formed in the substrate; FIGS. 6A and 6B together show the device isolation layer filling the device isolation trench; FIGS. 7A and 7B together show mask patterns spaced apart from each other and extending parallel to each other; FIGS. 8A and 8B together show the gate dielectric layer and the gate electrode; and FIGS. 9A and 9B together show an upper space of the plurality of space lines is prepared by removing part of the gate electrode by using the mask pattern as an etching mask;

DETAILED DESCRIPTION OF SOME EXAMPLE EMBODIMENTS

Hereinafter, some example embodiments of inventive concepts are described in detail with reference to the accompanying drawings.

Figure 1A:
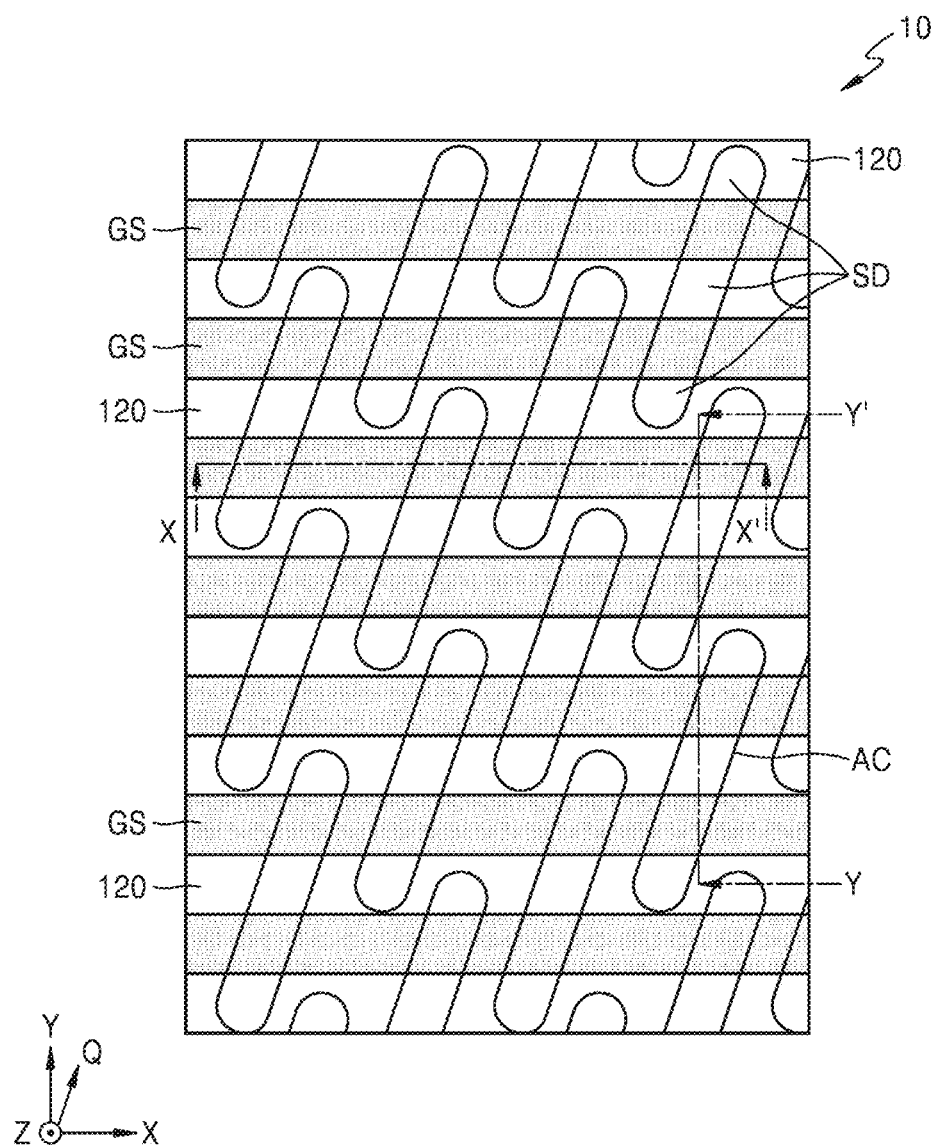
FIG. 1A is a plan view illustrating an integrated circuit device according to some example embodiments of inventive concepts.
Figure 1B:
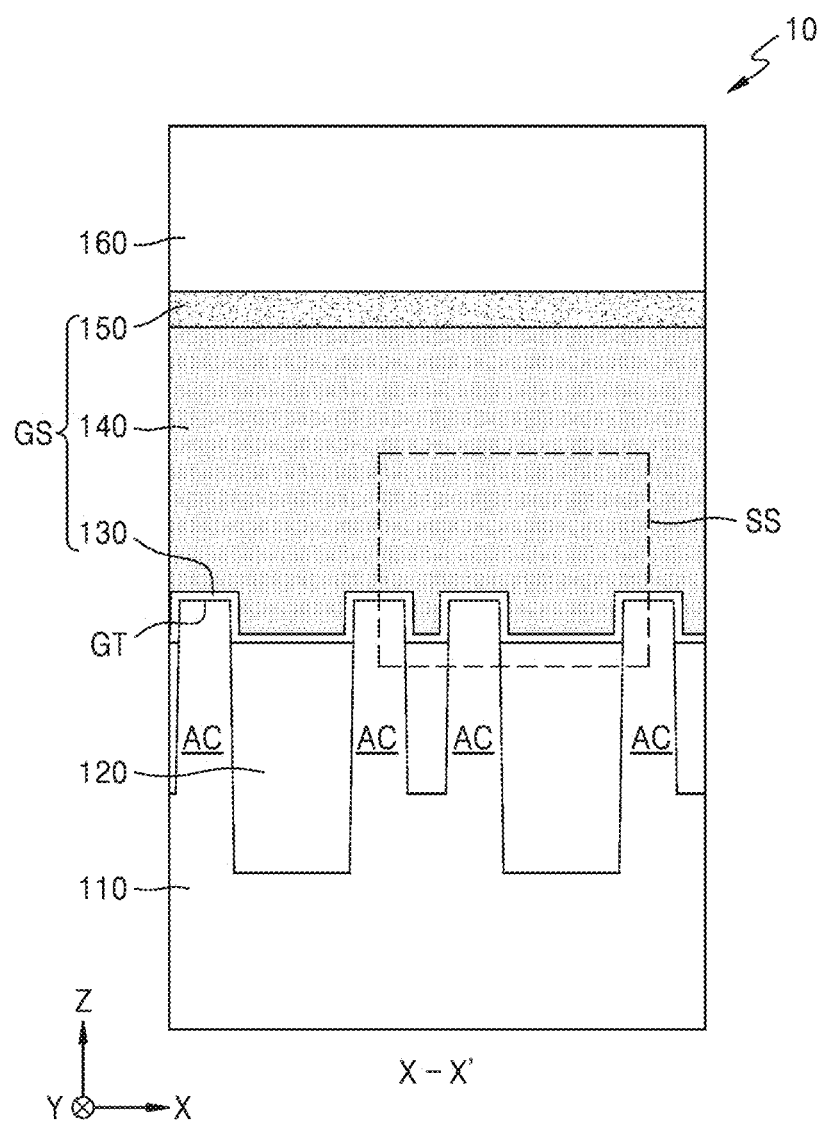
FIG. 1B is a cross-sectional view taken along line X-X' of FIG. 1A.
Figure 1C:
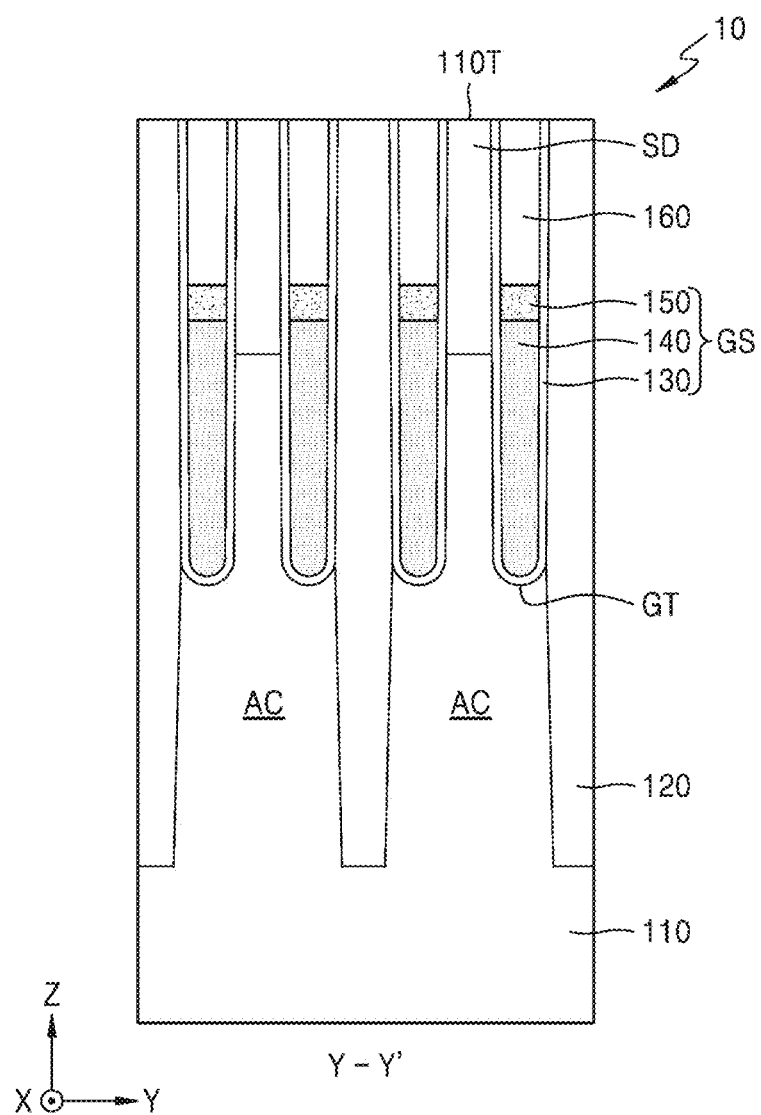
FIG. 1C is a cross-sectional view taken along line Y-Y' of FIG. 1A.
Figure 1D:
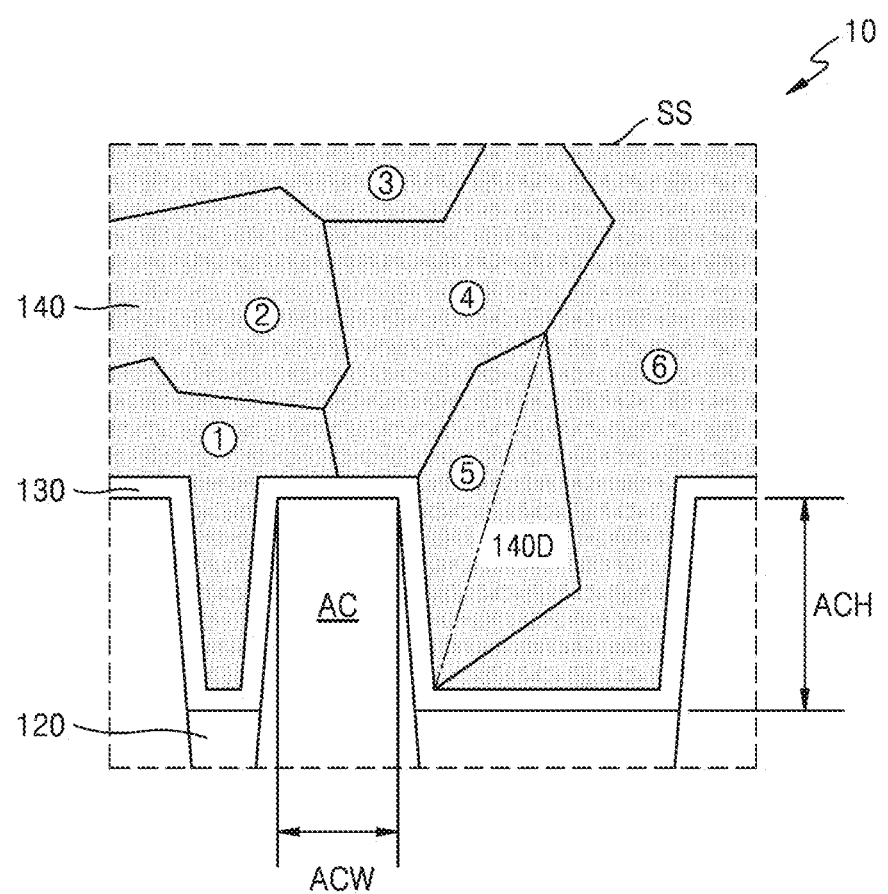
FIG. 1D is an enlarged cross-sectional view of a region SS of FIG. 1C.

FIG. 1A is a plan view illustrating an integrated circuit device according to some example embodiments of inventive concepts, FIG. 1B is a cross-sectional view taken along line X-X' of FIG. 1A, and FIG. 1C is a cross-sectional view taken along line Y-Y' of FIG. 1A, and FIG. 1D is an enlarged cross-sectional view of a region SS of FIG. 1C.

Referring to FIGS. 1A to 1D together, an integrated circuit device 10 includes a substrate 110 on which a plurality of active regions AC defined by a device isolation layer 120 and a plurality of gate trenches GT extending across the plurality of active regions AC are formed.

The plurality of active regions AC may be on or in the substrate 110. The substrate 110 may include, for example, silicon (Si). Alternatively, the substrate 110 may include a semiconductor element such as germanium (Ge), or a compound semiconductor such as silicon carbide (SiC), gallium arsenide (GaAs), indium arsenide (InAs), or indium phosphide (InP). Alternatively, the substrate 110 may have a silicon on insulator (SOI) structure. For example, the substrate 110 may include a buried oxide layer (BOX). The substrate 110 may be in single-crystal phase or in polycrystalline phase. The substrate 110 may be doped, e.g. may be lightly doped with at least one of boron, phosphorus, or arsenic; however, example embodiments are not limited thereto.

The plurality of active regions AC may repeat to be spaced apart from each other in a first horizontal direction (X direction) and a second horizontal direction (Y direction) and may each have a shape extending in an oblique direction to have a long axis in one direction (Q direction) different from the first horizontal direction (X direction) and the second horizontal direction (Y direction). The plurality of gate trenches GT may have a plurality of line shapes extending parallel to each other in the first horizontal direction (X direction). The Q direction may intersect the X direction at an angle that is not ninety degrees; for example, the Q direction may intersect the X direction at an angle of forty-five degrees or more and 80 degrees or less; however, example embodiments are not limited thereto.

The device isolation layer 120 may define the plurality of active regions AC in the substrate 110. The device isolation layer 120 may be formed of, e.g. may include, a silicon oxide, a silicon nitride, or a combination thereof. The device isolation layer 120 may extend in the first horizontal direction (X direction) on the substrate 110 and each may be spaced apart from each other in the second horizontal direction (Y direction) on the substrate 110.

A gate dielectric layer 130, a gate electrode 140 filling part of the gate trench GT on the gate dielectric layer 130, a gate passivation layer 150 covering the gate electrode 140 in the gate trench GT, and a capping insulation layer 160 on the gate passivation layer 150 in the gate trench GT may be formed in each of the plurality of gate trenches GT.

The gate dielectric layer 130, the gate electrode 140, and the gate passivation layer 150 may constitute or correspond to a gate structure GS.

A level of an exposed portion of the substrate 110 on a bottom surface of the gate trench GT may be higher than a level of an exposed portion of the device isolation layer 120. Accordingly, a bottom surface of the gate structure GS may have a rough shape corresponding to a bottom profile of the plurality of gate trenches GT. For example, saddle-fin field effect transistors (saddle FINFETs) may be formed in the plurality of active regions AC.

The gate dielectric layer 130 covers an inner surface of the gate trench GT to be in contact with the active region AC and the device isolation layer 120. In some example embodiments, the gate dielectric layer 130 may function as a gate insulating layer. In some example embodiments, the gate dielectric layer 130 may be formed with a thermal oxidation process such as with an in-situ steam generation (ISSG) process; however, example embodiments are not limited thereto.

The gate dielectric layer 130 may be formed of a silicon oxide, oxide/nitride/oxide (ONO), or a high-k dielectric layer having a higher dielectric constant than the silicon oxide. The high-k dielectric layer may include, for example, at least one of $HfO_2$, $Al_2O_3$, $HfAlO_3$, $Ta_2O_3$, $TiO_2$, or so on.

The gate electrode 140 may be formed of a metal, a metal nitride, a metal carbide, or a combination thereof. In some example embodiments, the gate electrode 140 may be formed of Ti, TiN, Ta, TaN, W, WN, TiSiN, WSiN, or a combination thereof. In the integrated circuit device 10 according to inventive concepts, the gate electrode 140 may be formed of a single metal, for example formed of a single tungsten (W) metal.

When the gate electrode 140 is formed of tungsten (W), crystal grains of the tungsten (W) may include or consist of, for example, ①, ②, ③, ④, ⑤, and ⑥ in the drawing, and each of the crystal grains may have a length from one vertex to another, e.g. may have a diagonal length (for example, 140D of ⑤). In inventive concepts, the diagonal length of each crystal grain is used as a measure indicating a grain size of each of the crystal grains. The diagonal length of a crystal grain may be or correspond to a length from one vertex of the crystal grain to another vertex of the crystal grain, e.g. a largest length between vertices of the crystal grain. The diagonal length of a crystal grain may be measured in cross-section, e.g. in a cross-sectional direction as illustrated in FIG. 1D; however, example embodiments are not limited thereto. The diagonal length of a crystal grain may be determined by various analytic techniques such as but not limited to transmission electron microscopy (TEM) and/or x-ray diffraction (XRD); however, example embodiments are not limited thereto.

The number and shapes of the crystal grains ①, ②, ③, ④, ⑤, and ⑥ illustrated in the drawings are an example and not limited thereto. In addition, only the diagonal length 140D of any one of the crystal grains ⑤ is illustratively described, but this may be equally applied to other crystal grains ①, ②, ③, ④, and ⑤.

The diagonal length 140D of each, a majority of, or at least one crystal grain may be greater than a height ACH of the active region AC that is in contact with the gate electrode 140. The height ACH of the active region AC indicates a height of a portion at which the active region AC protrudes from the device isolation layer 120. Alternatively or additionally, the diagonal length 140D of each crystal grain may be greater than a horizontal width ACW of a top surface of the active region AC in contact with the gate electrode 140.

Specifically, the diagonal lengths 140D of crystal grains may be in a range of about 80 nm to about 100 nm but are not limited thereto. Alternatively or additionally, each crystal grain may be configured to have a superlattice structure. In some example embodiments, in a cross-sectional view, the gate electrode 140 that is in contact with one active region AC may include seven or fewer grains of tungsten (W), e.g. averaged over various active regions AC. In the drawings, the number of crystal grains ①, ②, ④, ⑤, and ⑥ in contact with one active region AC is five but example embodiments are not limited thereto.

In order for each crystal grain to be formed in a size that is greater than or equal to a desired grain size, a fabrication facility (for example, a chemical vapor deposition facility) capable of forming a thin film with tungsten (W) may perform a process including the following recipe. In some example embodiments, each of or at least one of borane ($BH_3$), diborane ($B_2H_6$), monosilane ($SiH_4$), and tungsten hexafluoride ($WF_6$) may be used as a source gas of a process gas. Alternatively or additionally, a low-temperature process may include a nucleation layer forming process performed at a process temperature of about 250° C. or less and a bulk layer forming process performed at a process temperature of about 300° C. or less.

According to some examples, when the nucleation layer forming process is performed at a low-temperature process of about 250° C. or less, the reactivity of borane ($BH_3$) may be higher than the reactivity of diborane ($B_2H_6$). In this case, according to some example embodiments, by increasing (e.g. maximizing) dependence on borane ($BH_3$), sizes of crystal grains constituting a tungsten thin film may be relatively increased. Detailed description of the fabrication facility is described below with reference to FIG. 10. The increased size of the crystal grains included in the tungsten thin film may improve performance, such as speed and/or power, of the integrated circuit device 10.

A gate passivation layer 150 may be on the gate electrode 140. Specifically, the gate passivation layer 150 may be between the gate electrode 140 and the capping insulation layer 160. The gate passivation layer 150 may prevent or reduce the impact form and/or probability of different materials forming the gate electrode 140 and the capping insulation layer 160 from mutually diffusing and/or reacting between the gate electrode 140 and the capping insulation layer 160. The gate passivation layer 150 may be formed of or include, for example, doped or undoped polysilicon but is not limited thereto.

The capping insulation layer 160 fills the inside of the gate trench GT to be in contact with the gate dielectric layer 130. The capping insulation layer 160 may be formed of a silicon nitride, a silicon oxynitride, or a combination thereof. For example, the capping insulation layer 160 may be composed of a second composition different from a first composition constituting the gate dielectric layer 130. The second composition may include, for example, a silicon nitride.

The gate structure GS may have gate sidewalls facing the active region AC, and the capping insulation layer 160 has insulating sidewalls facing the active region AC. A source/drain region SD may be formed on both sides of the gate structure GS in the plurality of active regions AC. The source/drain region SD may be a raised source/drain region, e.g. may be formed with an epitaxial process; however, example embodiments are not limited thereto.

Recently, as the degree of integration of integrated circuit devices has been gradually increased, a structure of the integrated circuit device 10 including a buried channel array transistor (BCAT) having a plurality of word lines buried in a substrate has been proposed. Accordingly, various studies have been conducted to improve and/or stabilize an operation of and/or reliability of the BCAT.

In general, an integrated circuit device includes a gate electrode composed of dense crystal grains (for example, having a diagonal length that is less than a height of an active region). According to inventive concepts, the integrated circuit device 10 may include the gate electrode 140 composed of crystal grains having a relatively large grain size.

The integrated circuit device 10 according to inventive concepts reduces most grain boundaries at a portion where crystal grains constituting the gate electrode 140 meet the active region AC, and thus, a phenomenon may be significantly improved in which characteristics of transistors are degraded due to electrical defects. For example, as a row disturb error and/or passing gate effects may be reduced.

According to inventive concepts, by adjusting a grain size of a metal material forming the gate electrode 140 in the integrated circuit device 10 including a BCAT, the electrical characteristics of the integrated circuit device 10 may be improved.

Ultimately, according to inventive concepts, an operation and/or reliability of the integrated circuit device 10 may be improved and stabilized. Further, although example embodiments are described with reference to an integrated circuit device 10 including a BCAT, example embodiments are not limited thereto.

Figure 2:
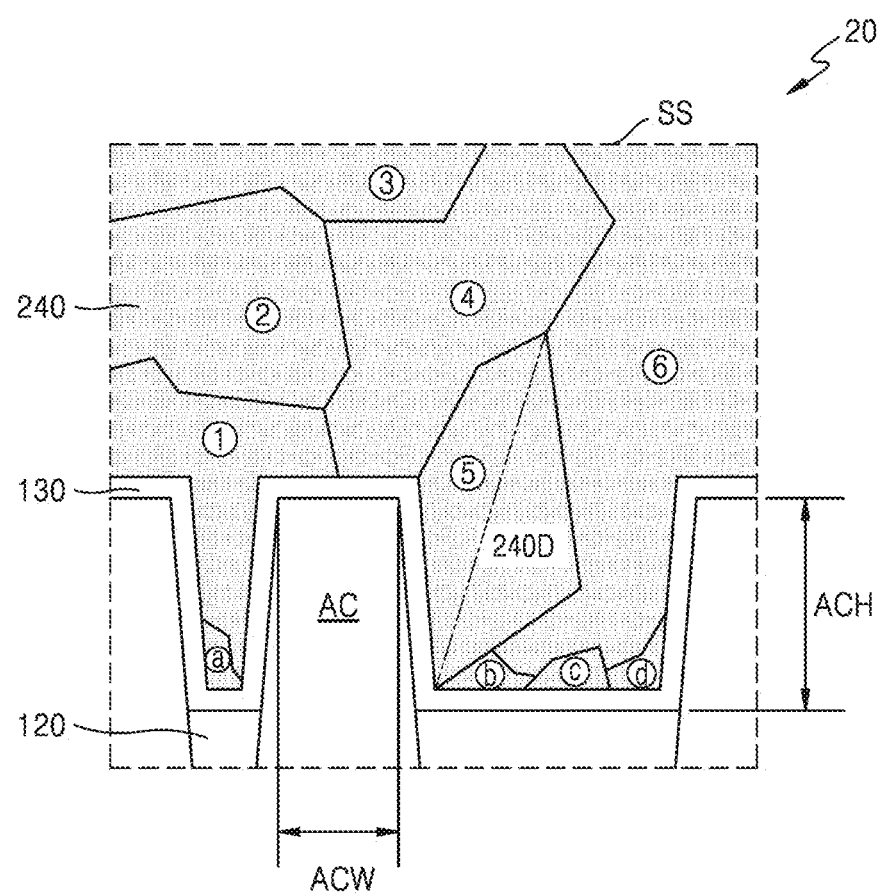
FIG. 2 is an enlarged cross-sectional view illustrating an integrated circuit device according to some example embodiments of inventive concepts.

FIG. 2 is an enlarged cross-sectional view illustrating an integrated circuit device according to some example embodiments of inventive concepts.

Most components constituting an integrated circuit device 20 to be described below and materials forming the components are substantially the same as or similar to the components and materials described above with reference to FIGS. 1A to 1D. Therefore, for the sake of convenient description, differences from the integrated circuit device 10 described above are mainly described.

Referring to FIG. 2, a gate electrode 240 of the integrated circuit device 20 may include first crystal grains and second crystal grains having a smaller grain size than the first crystal grains.

The gate electrode 240 of the integrated circuit device 20 according to the present embodiment may be formed of a single metal, preferably formed of a single tungsten (W) metal.

When the gate electrode 240 is formed of tungsten (W), crystal grains of the tungsten (W) may include relatively large first crystal grains (for example, ①, ②, ③, ④, ⑤, and ⑥ in FIG. 2) and relatively small second crystal grains (for example, ⓐ, ⓑ, ⓒ, and ⓓ in FIG. 2). Each of the first crystal grains may have a first diagonal length (for example, 240D of ⑤).

The number and/or shapes of the first crystal grains ①, ②, ③, ④, ⑤, and ⑥ and the number and shapes of the second crystal grains ⓐ, ⓑ, ⓒ, and ⓓ illustrated in the drawings are examples and not limited thereto. In addition, only the first diagonal length 240D of the first crystal grain ⑤ of any one of the first crystal grains is described as an example, but this may also be applied to the other first crystal grains ①, ②, ③, ④, and ⑥ in the same manner.

The first diagonal length 240D of the first crystal grains may be greater than the height ACH of the active region AC in contact with the gate electrode 240. The height ACH of the active region AC indicates a height of a portion at which the active region AC protrudes from the device isolation layer 120. Alternatively or additionally, the first diagonal length 240D of the first crystal grains may be greater than a horizontal width ACW of a top surface of the active region AC in contact with the gate electrode 240.

Specifically, the first diagonal lengths 240D of the first crystal grains may be in a range of about 80 nm to about 100 nm but are not limited thereto. Alternatively or additionally second diagonal lengths (not illustrated) of the second crystal grains may be in a range of about 20 nm or less but are not limited thereto. Alternatively or additionally, each of the first crystal grains may be configured to have a superlattice structure, e.g. a single metal structure comprising of alternating layers of two or more materials; however, example embodiments are not limited thereto.

In order for each of the first crystal grains to be formed in a size that is greater than or equal to a desired grain size, a fabrication facility (for example, a chemical vapor deposition facility) capable of forming a thin film of tungsten (W) may perform a process with substantially the same recipe as the recipe described with reference to FIGS. 1A to 1D.

However, in this process, the second crystal grains having a relatively small size in at least a portion of an interface may be formed, e.g. due to a difference between a material (conductor) forming the gate electrode 240 and a material (insulator) forming the gate dielectric layer 130.

Figure 3A:
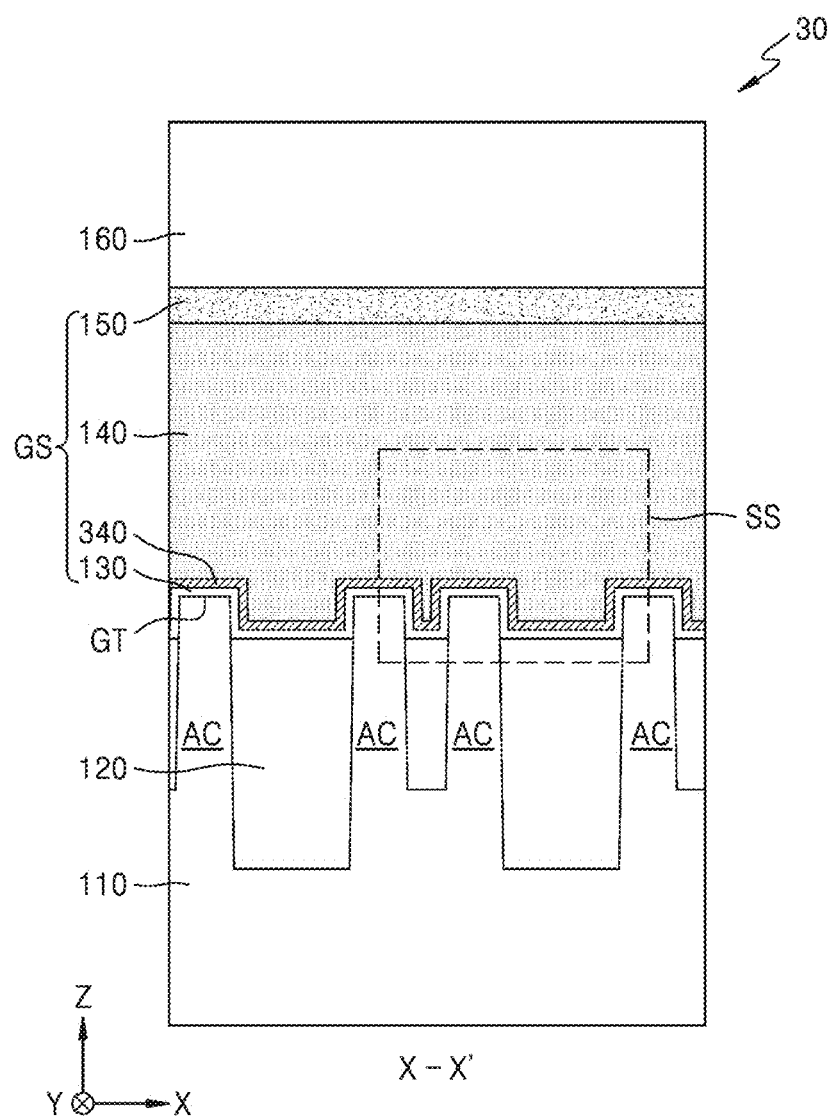
FIGS. 3A and 3B are cross-sectional views illustrating an integrated circuit device according to some example embodiments of inventive concepts.
Figure 3B:
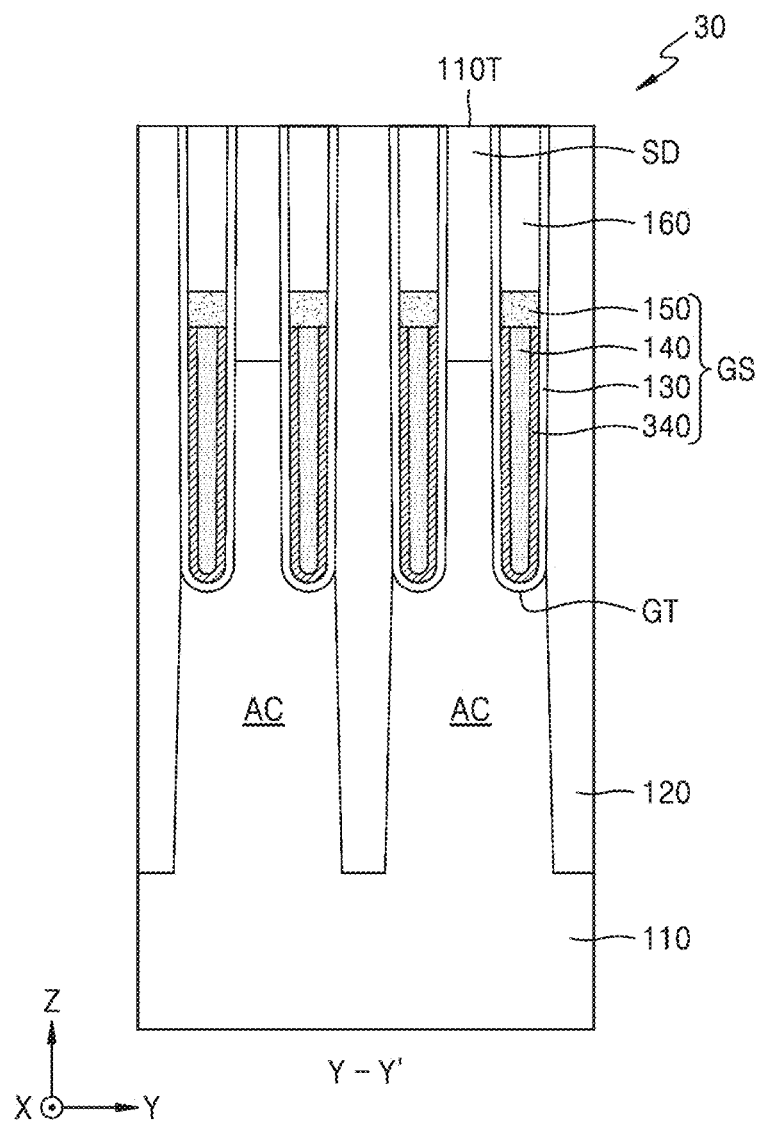
Figure 3C:
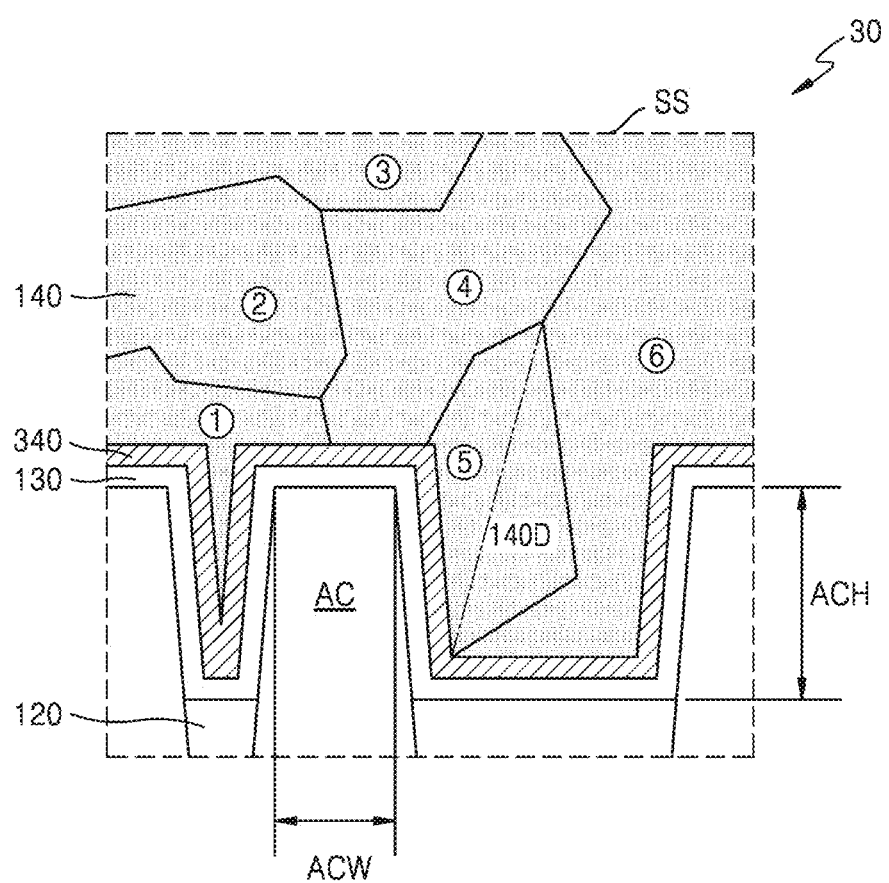
FIG. 3C is an enlarged cross-sectional view illustrating a region SS of FIG. 3B.

FIGS. 3A and 3B are cross-sectional views of an integrated circuit device according to some example embodiments of inventive concepts, and FIG. 3C is an enlarged cross-sectional view illustrating a region SS of FIG. 3A.

Most components constituting an integrated circuit device 30 to be described below and materials forming the components are substantially the same as or similar to the components and materials described above with reference to FIGS. 1A to 1D. Therefore, for the sake of convenient description, differences from the integrated circuit device 10 described above are mainly described.

Referring to FIGS. 3A to 3C together, the integrated circuit device 30 may include a gate barrier layer 340 between the gate electrode 140 and the gate dielectric layer 130.

In the integrated circuit device 30 according to some example embodiments, the gate barrier layer 340 may be formed to be in conformal contact with the gate dielectric layer 130. Accordingly, the gate electrode 140 may be spaced apart from the gate dielectric layer 130, and the gate electrode 140 may be surrounded by the gate barrier layer 340 and the gate passivation layer 150.

In some example embodiments, the gate barrier layer 340 may be formed of a metal nitride, for example, at least one of TiN, TaN, WN, or so on but is not limited thereto. In the integrated circuit device 30 according to inventive concepts, the gate barrier layer 340 may be formed of a titanium nitride (TiN).

Figure 4:
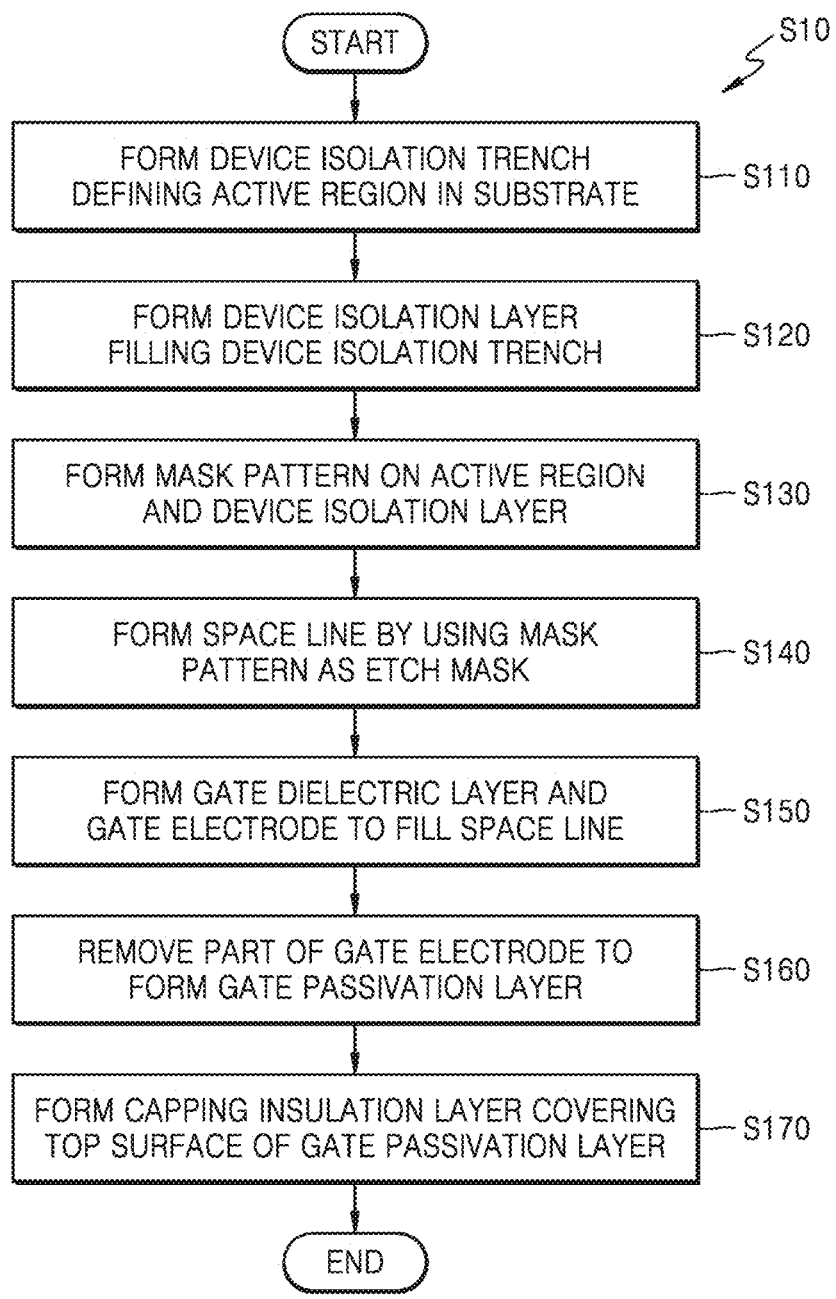
FIG. 4 is a flowchart illustrating a process sequence of a method of fabricating an integrated circuit device, according to some example embodiments of inventive concepts.

FIG. 4 is a flowchart illustrating a process sequence illustrating a method of fabricating an integrated circuit device according to some example embodiments of inventive concepts.

Referring to FIG. 4, a method S10 of fabricating an integrated circuit device may include a process sequence of first to seventh steps S110 to S170.

In a case in which example embodiment may be implemented differently, the process sequence may be performed differently from the sequence to be described below. For example, two processes described in succession may be performed at substantially the same time, e.g. on or within the same tool or equipment, or may be performed in a sequence opposite to the described sequence.

The method S10 of fabricating an integrated circuit device according to inventive concepts may include the following steps but is not limited thereto.

The method S10 of fabricating an integrated circuit device includes a first step (S110) of forming a device isolation trench defining an active region in a substrate, a second step S120 of forming a device isolation layer filling the device isolation trench, a third step S130 of forming a mask pattern on the active region and the device isolation layer, a fourth step S140 of forming a space line by using the mask pattern as an etch mask, a fifth step S150 of forming a gate dielectric layer and a gate electrode filling the space line, a sixth step S160 of removing part of the gate electrode and forming a gate passivation layer, and a seventh step S170 of forming a capping insulation layer covering a top surface of the gate passivation layer.

Technical characteristics of the first to seventh steps S110 to S170 are described in detail with reference to FIGS. 5A to 9B to be described below.

FIGS. 5A, 6A, 7A, 8A, and 9A are plan views illustrating a process sequence of a method of fabricating an integrated circuit device, according to some example embodiments of inventive concepts, and FIGS. 5B, 6B, 7B, 8B, and 9B are cross-sectional views illustrating together cross-sections taken along lines X-X' and Y-Y' of FIGS. 5A, 6A, 7A, 8A, and 9A.

Figure 5A:
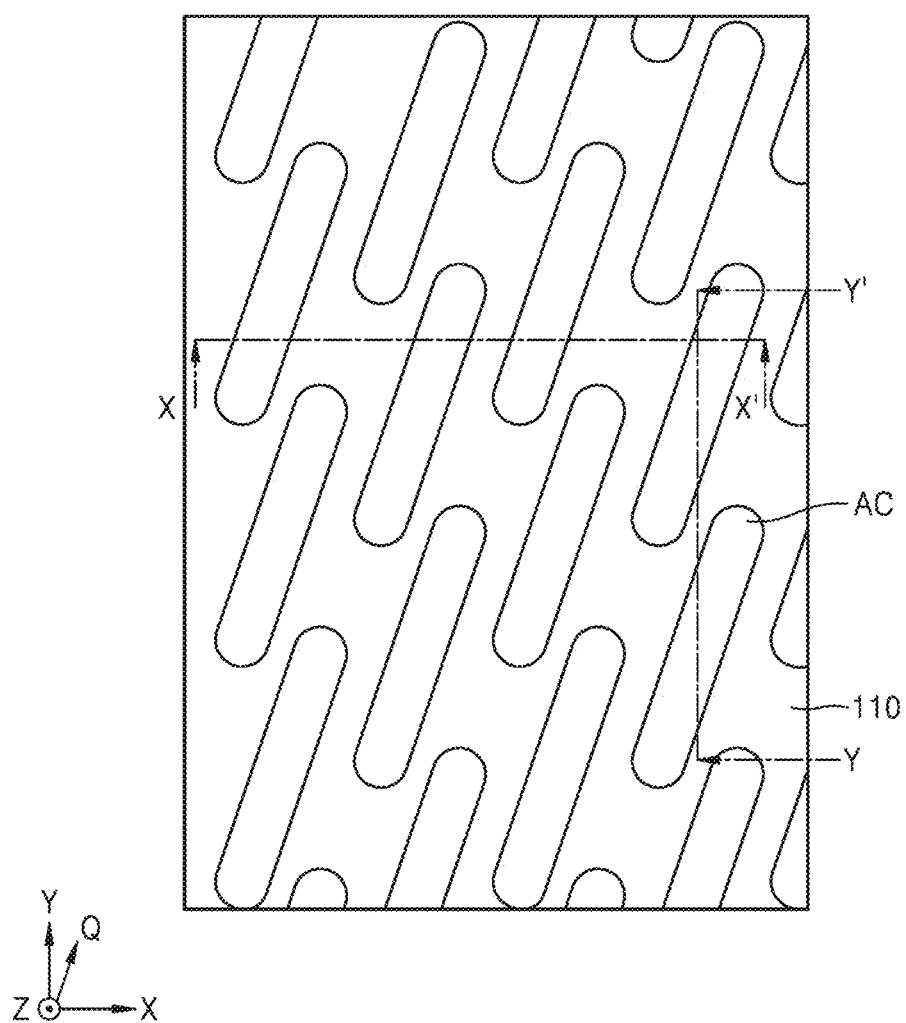
FIGS. 5A, 6A, 7A, 8A, and 9A are plan views illustrating a process sequence of a method of fabricating an integrated circuit device, according to some example embodiments of inventive concepts.
Figure 5B:
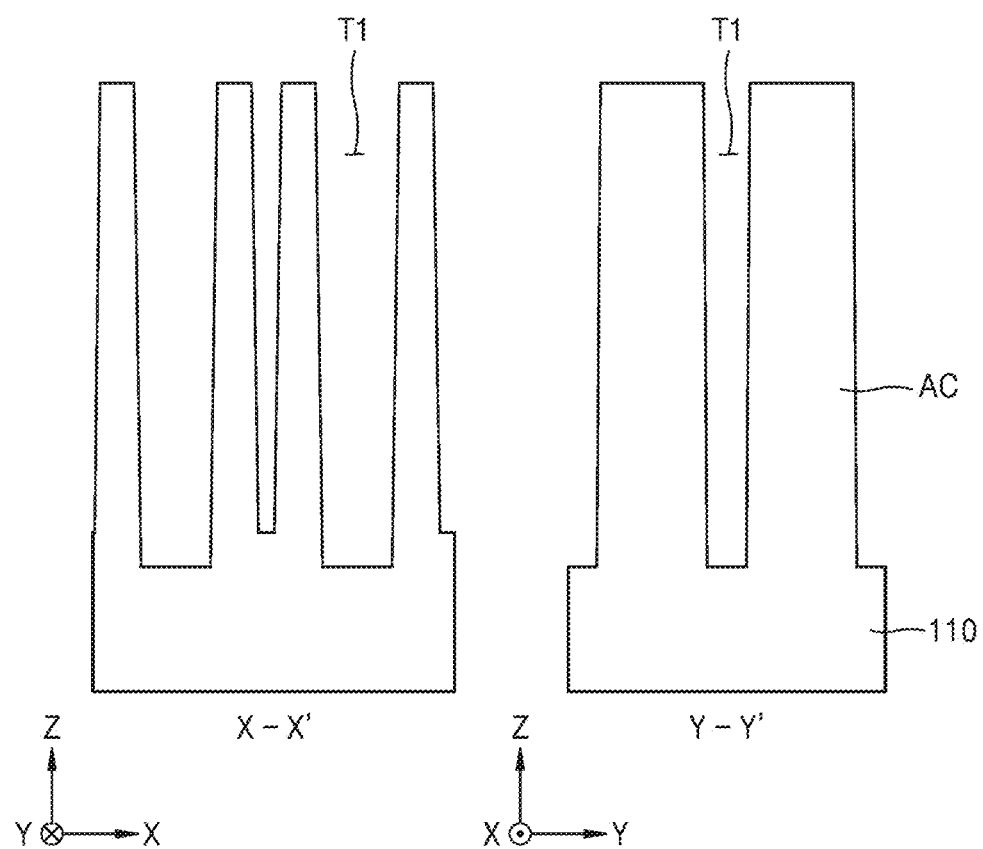
FIGS. 5B, 6B, 7B, 8B, and 9B are cross-sectional views illustrating together cross-sections taken along lines X-X' and Y-Y' of FIGS. 5A, 6A, 7A, 8A, and 9A.

Referring to FIGS. 5A and 5B together, a device isolation trench T1 defining a plurality of active regions AC may be formed in the substrate 110.

The plurality of active regions AC defined by the device isolation trench T1 may be on the substrate 110. The substrate 110 may be, for example, a semiconductor wafer including silicon (Si) such as lightly doped single-crystal silicon on a 200 mm, or 300 mm, or 450 mm wafer.

The plurality of active regions AC may repeat spaced apart from each other in the first horizontal direction (X direction) and the second horizontal direction (Y direction), and may each have a shape extending in an oblique direction to have a long axis in one direction (Q direction) different from the first horizontal direction (X direction) and the second horizontal direction (Y direction).

In the device isolation trench T1, a portion having a relatively great width may be formed to have a relatively great depth, and a portion having a relatively small width may be formed to have a relatively small depth.

Figure 6A:
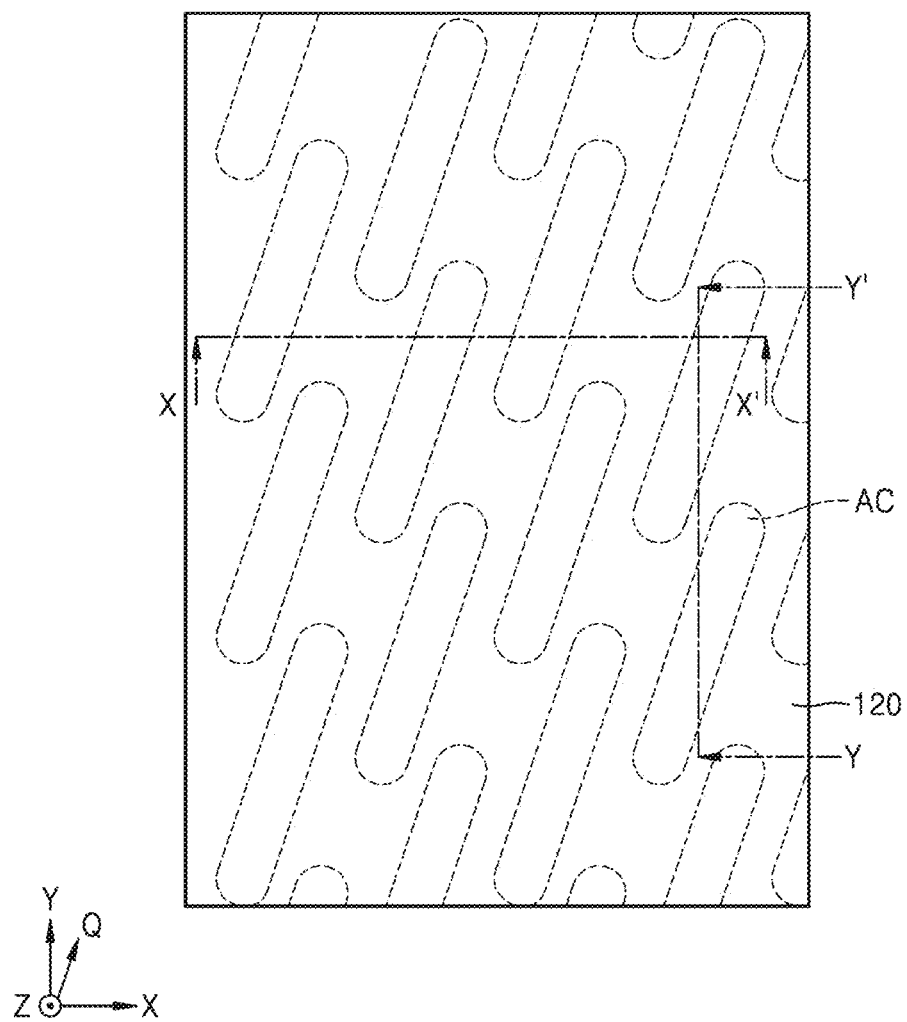
Figure 6B:
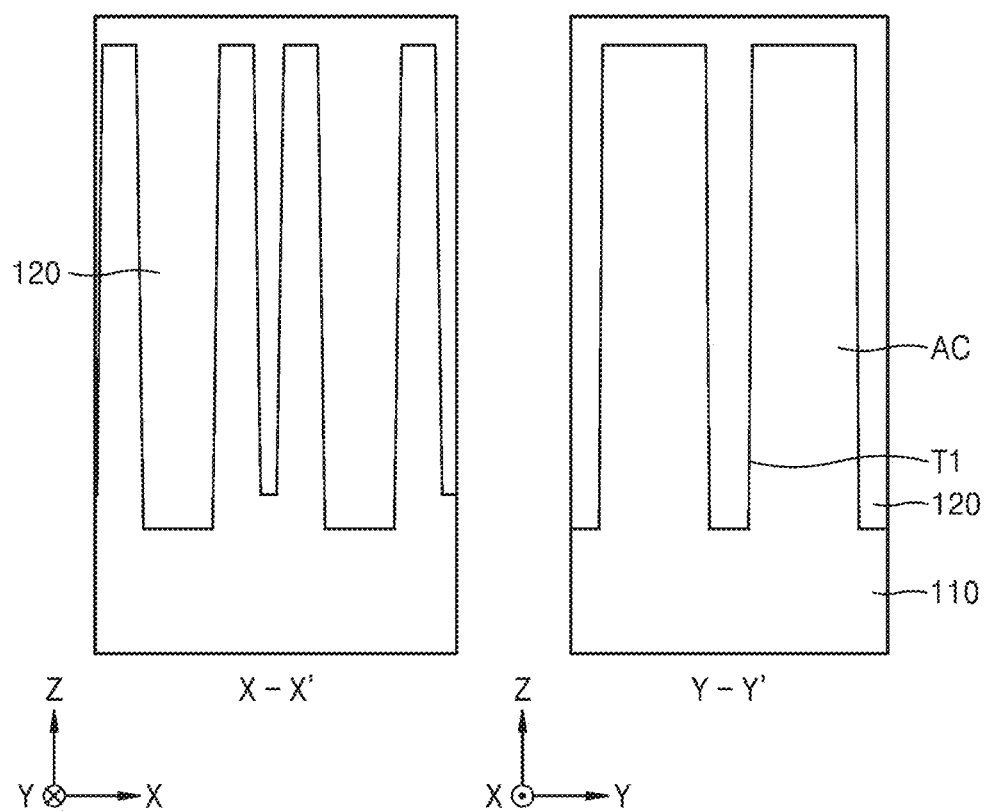

Referring to FIGS. 6A and 6B together, the device isolation layer 120 filling the device isolation trench T1 may be formed around the plurality of active regions AC.

The device isolation layer 120 may be formed to cover all the top surfaces of the plurality of active regions AC. In a plan view, locations of the plurality of active regions AC are represented by dashed lines for better understanding. Portions of the device isolation layer 120 that cover the top surfaces of the plurality of active regions AC may protect or help to protect a surface of the substrate 110 during an ion injection process/ion implantation process for injecting impurity ions into the substrate 110 in subsequent processes and/or during a subsequent etching process.

The device isolation layer 120 may include a silicon oxide layer, a silicon nitride layer, or a combination thereof. At least one process selected from an atomic layer deposition (ALD) process, a chemical vapor deposition (CVD) process, a radical oxidation process, and a natural oxidation process may be used to form the device isolation layer 120. The device isolation layer 120 may be formed with a shallow-trench isolation (STI) process and/or with a spin-on glass (SOG) process; however, example embodiments are not limited thereto.

Figure 7A:
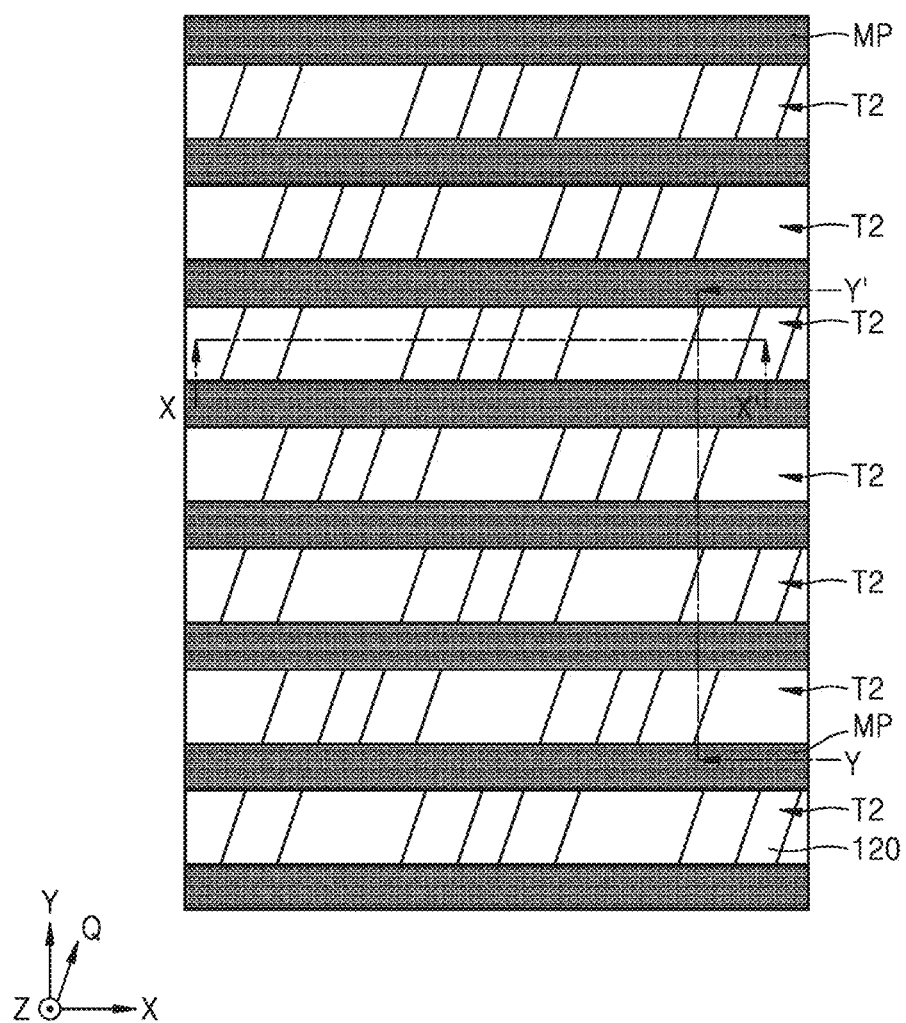
Figure 7B:
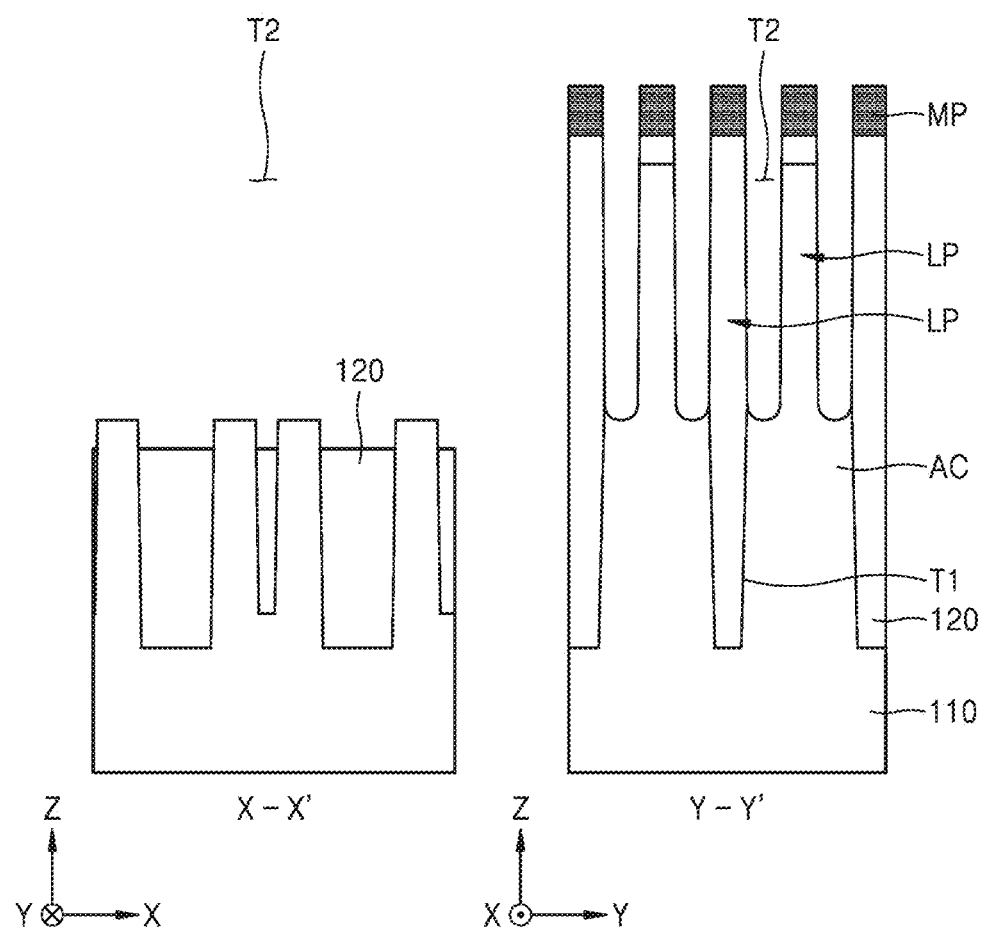

Referring to FIGS. 7A and 7B together, mask patterns MP spaced apart from each other and extending parallel to each other in the first horizontal direction (X direction) may be formed on the plurality of active regions AC and the device isolation layer 120.

The mask patterns MP may each be formed of a line-and-space pattern. For example, the mask patterns MP may each be formed of a silicon nitride, polysilicon, spin-on-hardmask (SOH), photoresist, or a combination thereof but are not limited thereto.

The plurality of active regions AC and the device isolation layer 120 are etched by using the mask patterns MP as an etch mask, and thus, a plurality of space lines T2 extending parallel to each other in the first horizontal direction (X direction) and a plurality of line patterns LP defining the plurality of space lines T2 may be formed.

The plurality of line patterns LP may include some of the plurality of active regions AC, part of the device isolation layer 120, and the mask patterns MP.

Part of the substrate 110 and part of the device isolation layer 120 may be exposed on bottom surfaces of the plurality of space lines T2. As illustrated, on the bottom surfaces of the plurality of space lines T2, a level of the portion where the substrate 110 is exposed may be higher than a level of the portion where the device isolation layer 120 is exposed.

Figure 8A:
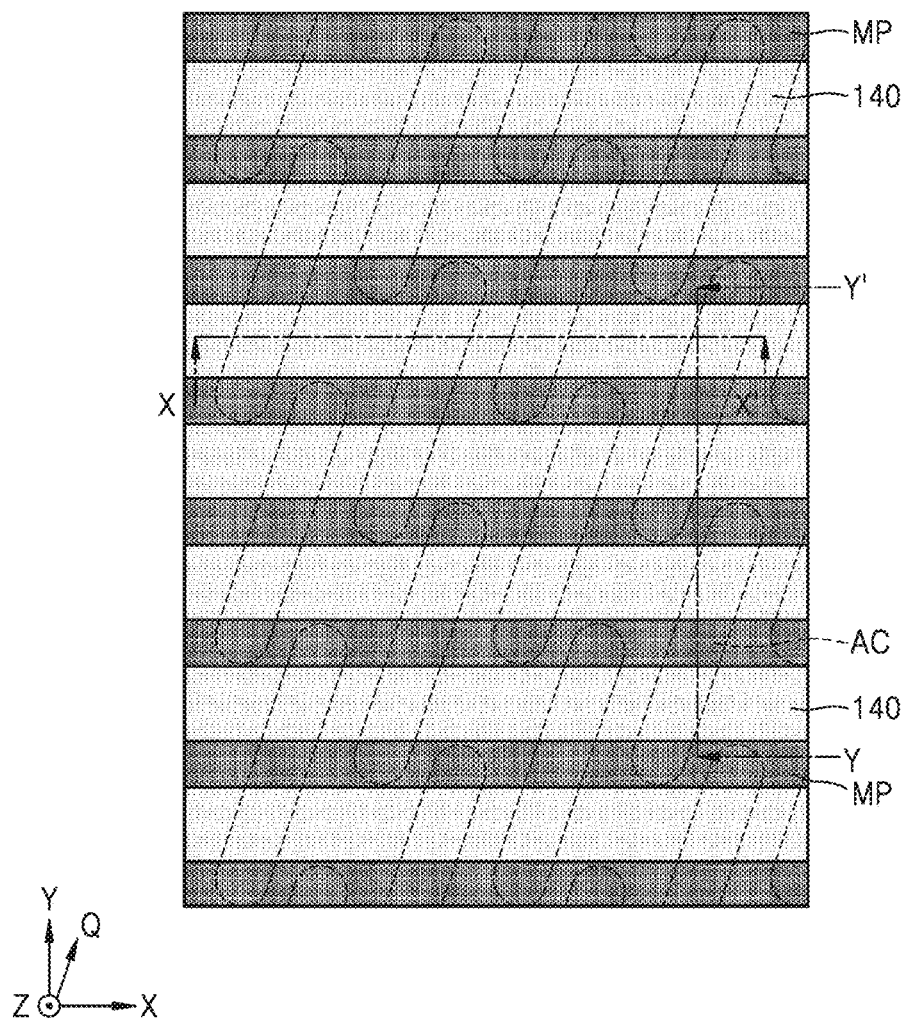
Figure 8B:
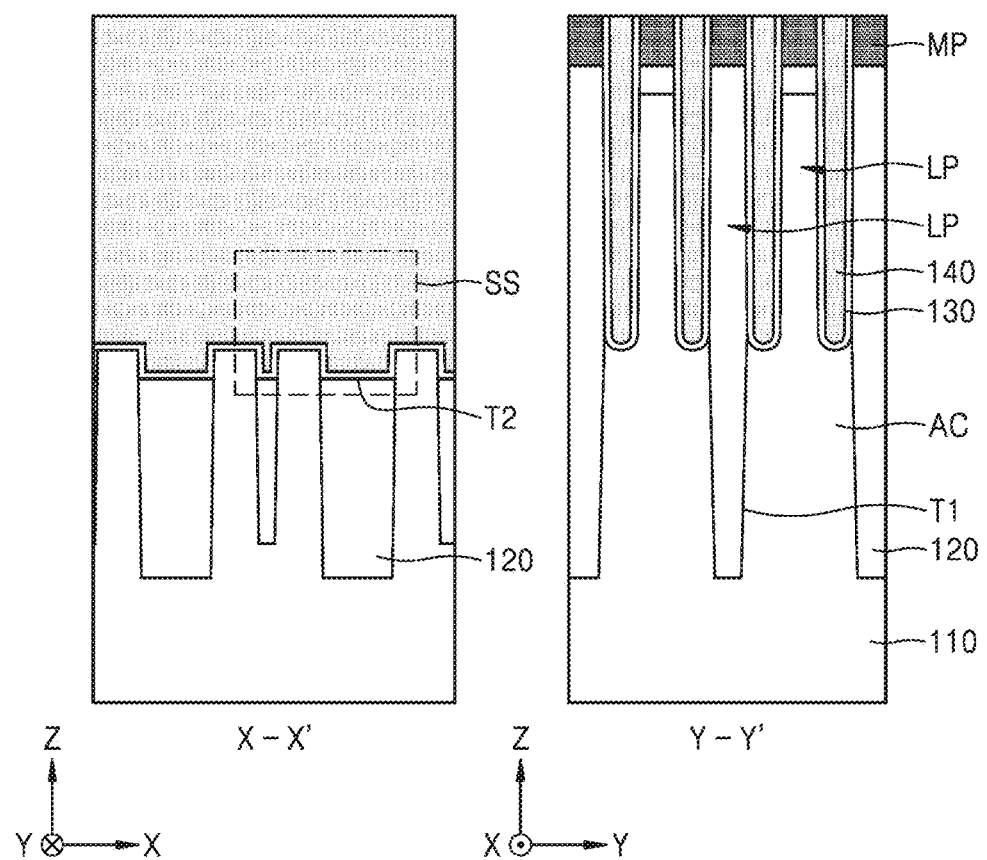

Referring to FIGS. 8A and 8B together, the gate dielectric layer 130 and the gate electrode 140 may be formed to fill the space line T2 between the line patterns LP.

The gate dielectric layer 130 in contact with a surface of the substrate 110 and a surface of the device isolation layer 120 in the space line T2, and the gate electrode 140 filling the remaining space of the space line T2 on the gate dielectric layer 130 may be formed.

On bottom surfaces of the plurality of space lines T2, a level of the portion where the substrate 110 is exposed may be higher than a level of the portion where the isolation layer 120 is exposed, and accordingly, a bottom surface of the gate electrode 140 may have a rough shape corresponding to a bottom profile of the plurality of space lines T2. Therefore, saddle FINFETs may be formed in the plurality of active regions AC.

The gate dielectric layer 130 may include an oxide layer formed by an automatic layer deposition (ALD) process and/or a thermal oxidation process such as an in-situ steam generation process. In some example embodiments, the gate dielectric layer 130 may be formed of a silicon oxide, $HfO_2$, $Al_2O_3$, $HfAlO_3$, $Ta_2O_3$, $TiO_2$, or oxide/nitride/oxide (ONO) but is not limited thereto.

Here, referring to a region SS of FIG. 8B corresponding to the region SS of FIG. 1D, the gate electrode 140 may be formed of, e.g. may include or consist of or consist essentially of, a single metal, for example a single tungsten (W) metal. When the gate electrode 140 is be formed of tungsten (W), crystal grains of the tungsten (W) may include or consist of, for example, ①, ②, ③, ④, ⑤, and ⑥ in the drawing, and each of the crystal grains may have a diagonal length (for example, 140D of ⑤).

The diagonal length 140D of each crystal grain may be greater than a height ACH of the active region AC in contact with the gate electrode 140. Alternatively or additionally, the diagonal length 140D of each crystal grain may be greater than a horizontal width ACW of a top surface of the active region AC in contact with the gate electrode 140.

Figure 9A:
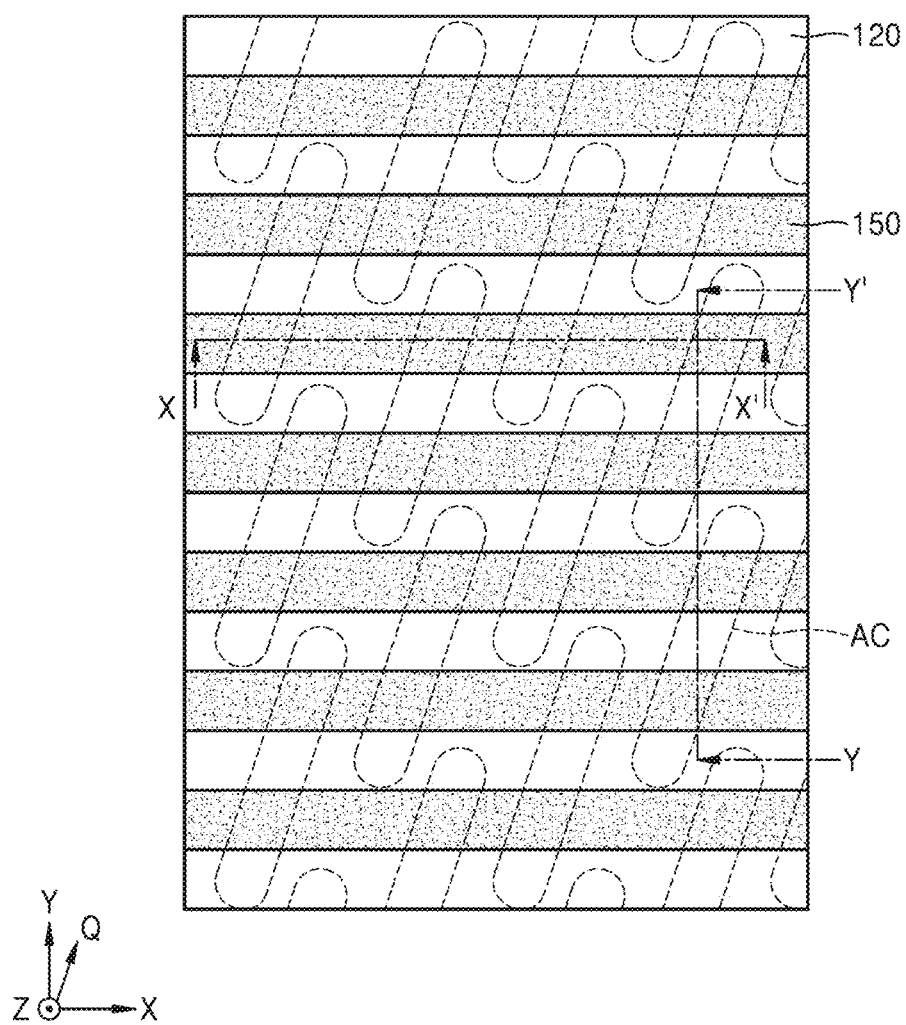
Figure 9B:
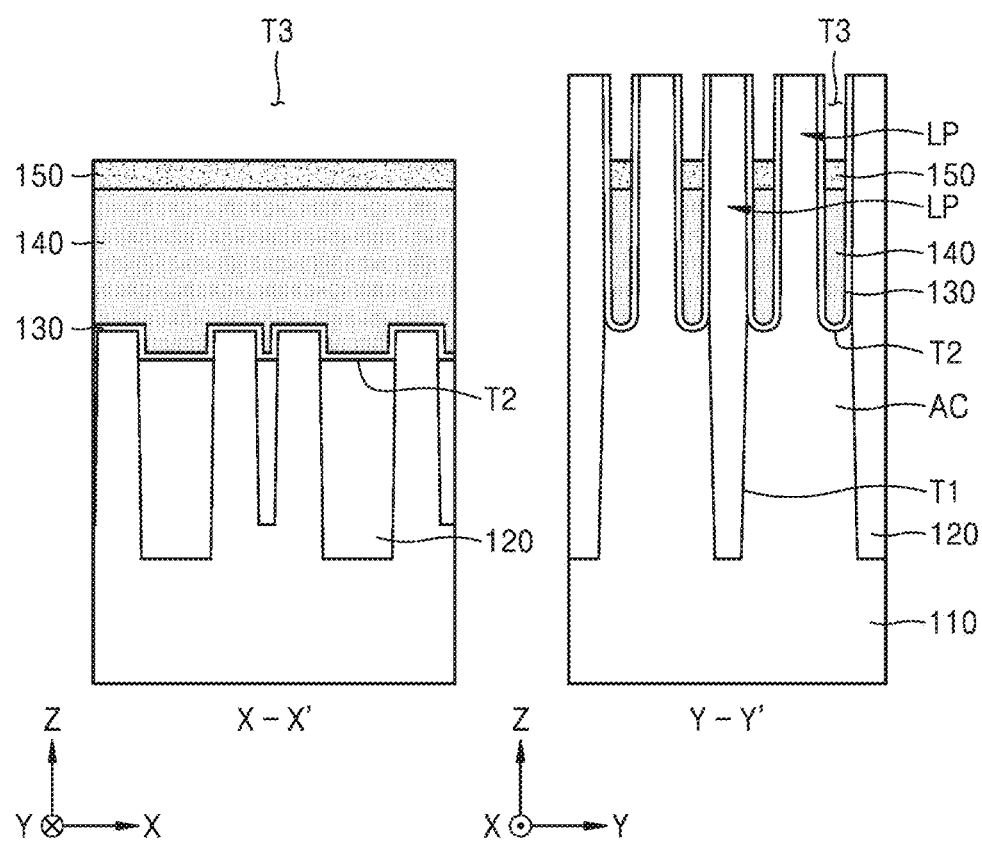

Referring to FIGS. 9A and 9B together, an upper space T3 of the plurality of space lines is prepared by removing part of the gate electrode 140 by using the mask pattern MP (refer to FIG. 8B) as an etching mask, and then, part of the upper space T3 of the plurality of space lines may be filled with the gate passivation layer 150.

The gate passivation layer 150 may include a silicon nitride layer and/or polysilicon. The gate passivation layer 150 may prevent or reduce the impact of and/or likelihood of different materials forming the gate electrode 140 and the capping insulation layer 160 (refer to FIG. 1B) to be formed in the subsequent process from mutually diffusing or reacting between the gate electrode 140 and the capping insulation layer 160. In some example embodiments, the gate passivation layer 150 may be omitted.

Referring back to FIGS. 1A to 1D together, the capping insulation layer 160 may be formed to completely fill the upper space T3 of the plurality of space lines and to cover a top surface of the gate passivation layer 150.

Next, a planarization process may be performed to remove an unnecessary material layer on the substrate 110 so that an upper surface 110T of the substrate 110 is exposed. In some example embodiments, an etch-back process and/or a chemical mechanical polishing (CMP) process may be performed for the planarization process.

The integrated circuit device 10 according to inventive concepts may be fabricated by using the method S10 of fabricating an integrated circuit device described above. According to inventive concepts, by adjusting a grain size of a metal material forming the gate electrode 140 in the integrated circuit device 10 including a BCAT, the electrical characteristics of the integrated circuit device 10 are improved.

Figure 10:
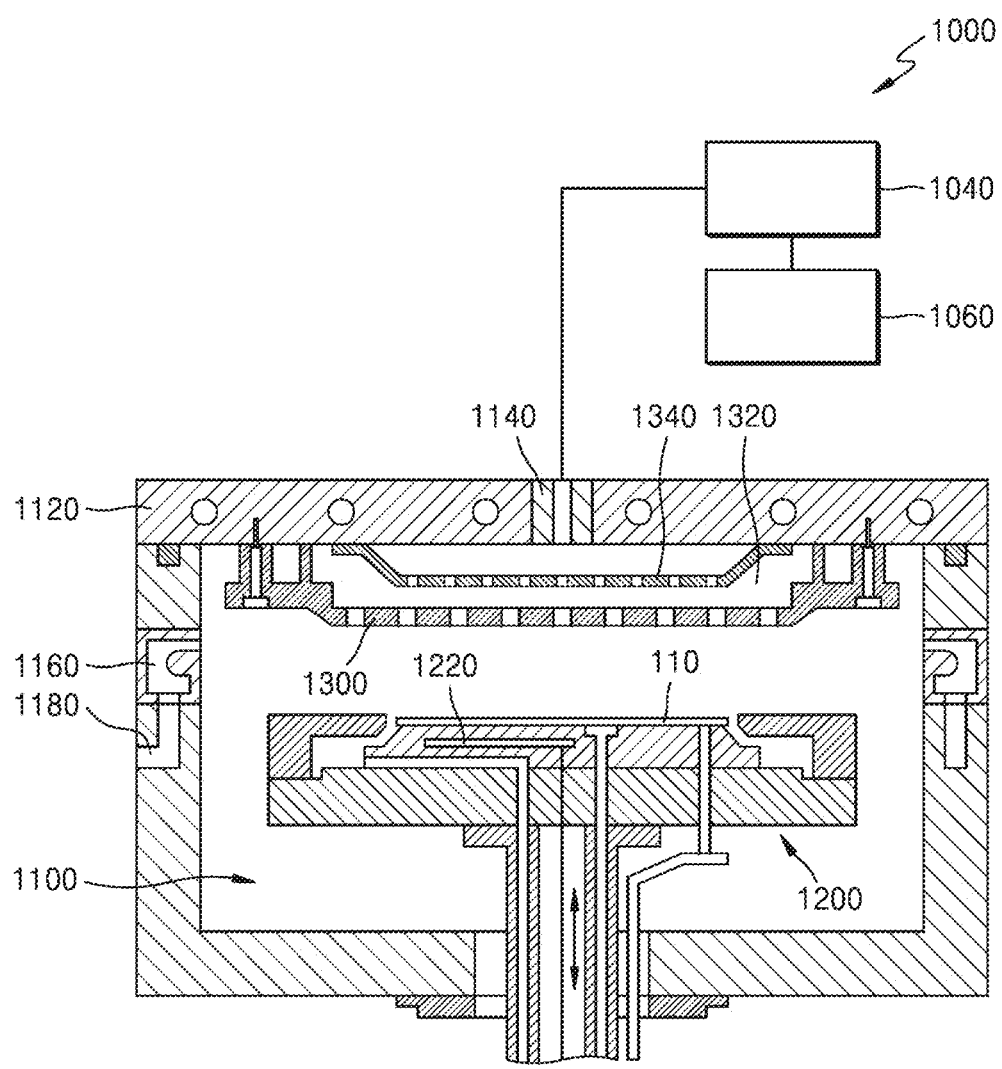
FIG. 10 is a cross-sectional configuration view of a process chamber that may be used to perform a method of fabricating an integrated circuit device according to some example embodiments of inventive concepts.

FIG. 10 is a cross-sectional configuration view of a process chamber that may be used to implement a method of fabricating an integrated circuit device according to some example embodiments of inventive concepts.

FIG. 10 schematically illustrates a process chamber 1000 of a chemical vapor deposition (CVD) facility that may be used to form a tungsten thin film on a substrate 110.

The process chamber 1000 may be part of a fabrication facility including a plurality of chambers. The process chamber 1000 may include a sidewall, a bottom, and a cover 1120 forming a chamber interior region 1100. The sidewall and bottom of the process chamber 1000 may be made of a single aluminum block. The sidewall of the process chamber 1000 may include a conduit (not illustrated), and a fluid for adjusting a temperature of the sidewall of the process chamber 1000 may flow through the conduit. Alternatively or additionally, the process chamber 1000 may include a pumping ring 1160 connecting the chamber interior region 1100 to an exhaust port 1180.

A substrate support member 1200 capable of adjusting a temperature may be near the center of the chamber interior region 1100. The substrate support member 1200 supports the substrate 110 during a tungsten thin film forming process. In general, the substrate support member 1200 may be made of aluminum, ceramic, or a combination of aluminum and ceramic and may include a vacuum port (not illustrated) and one or more heating members 1220.

Vacuum may be applied between the substrate 110 and the substrate support member 1200 by using the vacuum port to fix the substrate 110 to the substrate support member 1200 during the tungsten thin film forming process. The heating member 1220 may be in the substrate support member 1200 to heat the substrate support member 1200 and the substrate 110 on the substrate support member 1200 to a certain temperature.

The cover 1120 may be supported by the sidewall of the process chamber 1000 and removed for maintenance of the process chamber 1000. In general, the cover 1120 may be made of aluminum and may have a conduit therein, and a fluid for adjusting a temperature of the cover 1120 may flow through the conduit.

A mixing block 1140 may be inside the cover 1120. The mixing block 1140 may be connected to a gas supply source

1040. In general, individual gases supplied from the gas supply source 1040 are mixed with each other in the mixing block 1140. The gases are mixed into a single uniform gas flow in the mixing block 1140, and the single uniform gas flow is supplied to the chamber interior region 1100 through a shower head 1300. The gas supply source 1040 may be located at or near other components of the process chamber 1000, or may be located in a separate facility form the process chamber 1000.

The shower head 1300 may be connected to the cover 1120. In addition, a perforated blocker plate 1340 may be selectively arranged in a shower head interior region 1320 between the shower head 1300 and the cover 1120. A gas to be supplied to the chamber interior region 1100 through the mixing block 1140 is first diffused by the perforated blocker plate 1340. Then, the gas is supplied to the chamber interior region 1100 through the shower head 1300. The perforated blocker plate 1340 and the shower head 1300 are configured to provide a uniform gas flow into the chamber interior region 1100. The uniform gas flow promotes formation of a uniform tungsten thin film on the substrate 110.

A gas line for supplying process gases such as a tungsten-containing gas and a reducing gas from the gas supply source 1040 to the chamber interior region 1100 may include a valve (not illustrated) for diverting a gas flow.

Alternatively or additionally, the gas supply source 1040 may be controlled by a gas controller 1060. For example, the gas controller 1060 may control at least one of the type of gas supplied to the chamber interior region 1100, a supply time and an end time of the gas, and a flow rate of the gas by controlling the gas supply source 1040. The gas controller 1060 may be a mass flow controller, and/or a programmable logic controller (PLC); however, example embodiments are not limited thereto. The gas controller 1060 may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

In order to fabricate the integrated circuit devices 10, 20, and 30 according to inventive concepts described above, the gas supply source 1040 may supply borane ($BH_3$), diborane ($B_2H_6$), monosilane ($SiH_4$), and tungsten hexafluoride ($WF_6$), at least one of which may be a process gas, and the gas controller 1060 may control the process gas to an appropriate value.

Some example embodiments according to inventive concepts in which a gas is supplied into the process chamber 1000 to form a tungsten thin film is described as follows.

First, the substrate 110 is loaded into the process chamber 1000, and the substrate 110 is mounted on the substrate support member 1200. The substrate 110 may include a plurality of rough patterns formed by the active region AC (refer to FIG. 8B), and the gate dielectric layer 130 formed on the plurality of rough patterns.

Next, a certain amount of process gases is supplied from the gas supply source 1040 to the mixing block 1140 under the control of the gas controller 1060, and the process gas is substantially and uniformly supplied from the shower head 1300 to the chamber interior region 1100.

At the same time, the heating member 1220 located in the substrate support member 1200 is driven to emit thermal energy while maintaining the chamber internal region 1100 at a certain pressure by exhausting an atmosphere of the chamber interior region 1100 to the exhaust port 1180.

The emitted thermal energy may heat an upper portion of the substrate support member 1200 to heat the substrate 110 mounted on the substrate support member 1200 to a certain temperature. The supplied process gas may cause a chemical reaction to form a tungsten thin film on the entire surface of the substrate 110.

In order to fabricate the integrated circuit devices 10, 20, and 30 according to inventive concepts described above, the heating member 1220 may operate such that a low-temperature process including a nucleation layer forming process performed at a process temperature of about 250° C. or less and a bulk layer forming process performed at a process temperature of about 300° C. or less is performed.

Figure 11A:
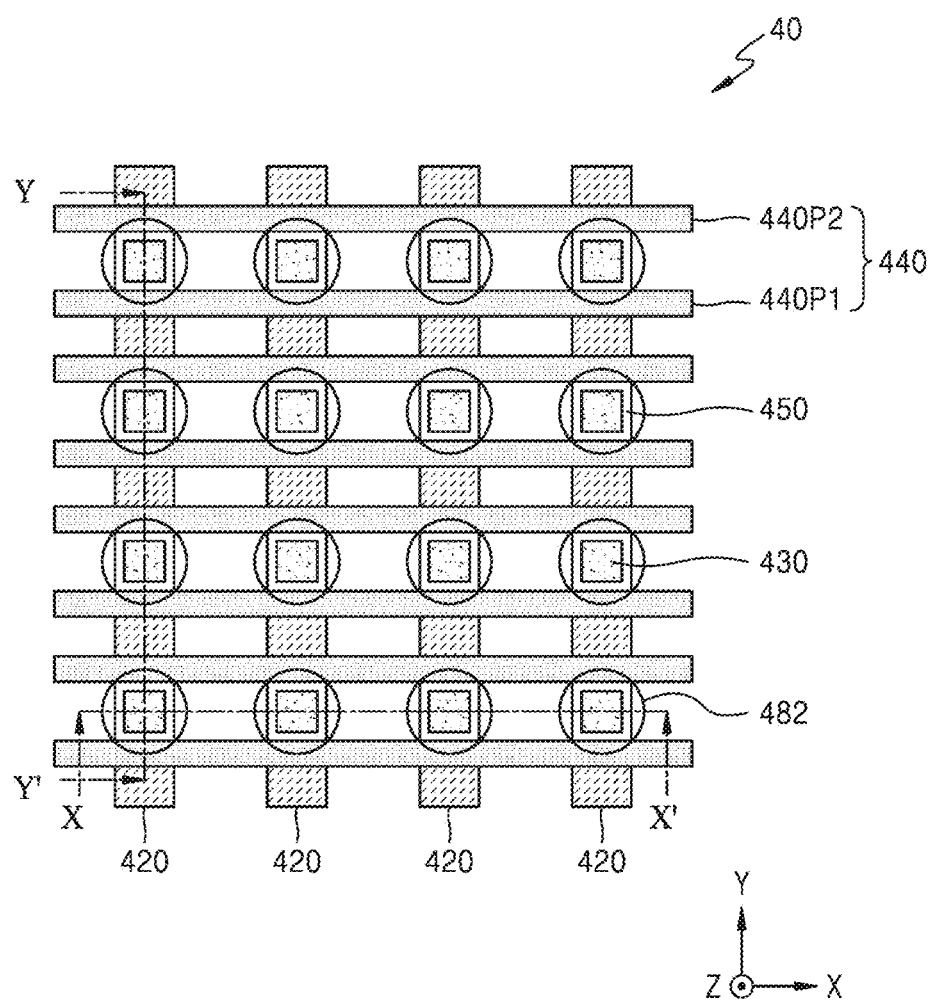
FIG. 11A is a layout illustrating an integrated circuit device according to some example embodiments of inventive concepts.
Figure 11B:
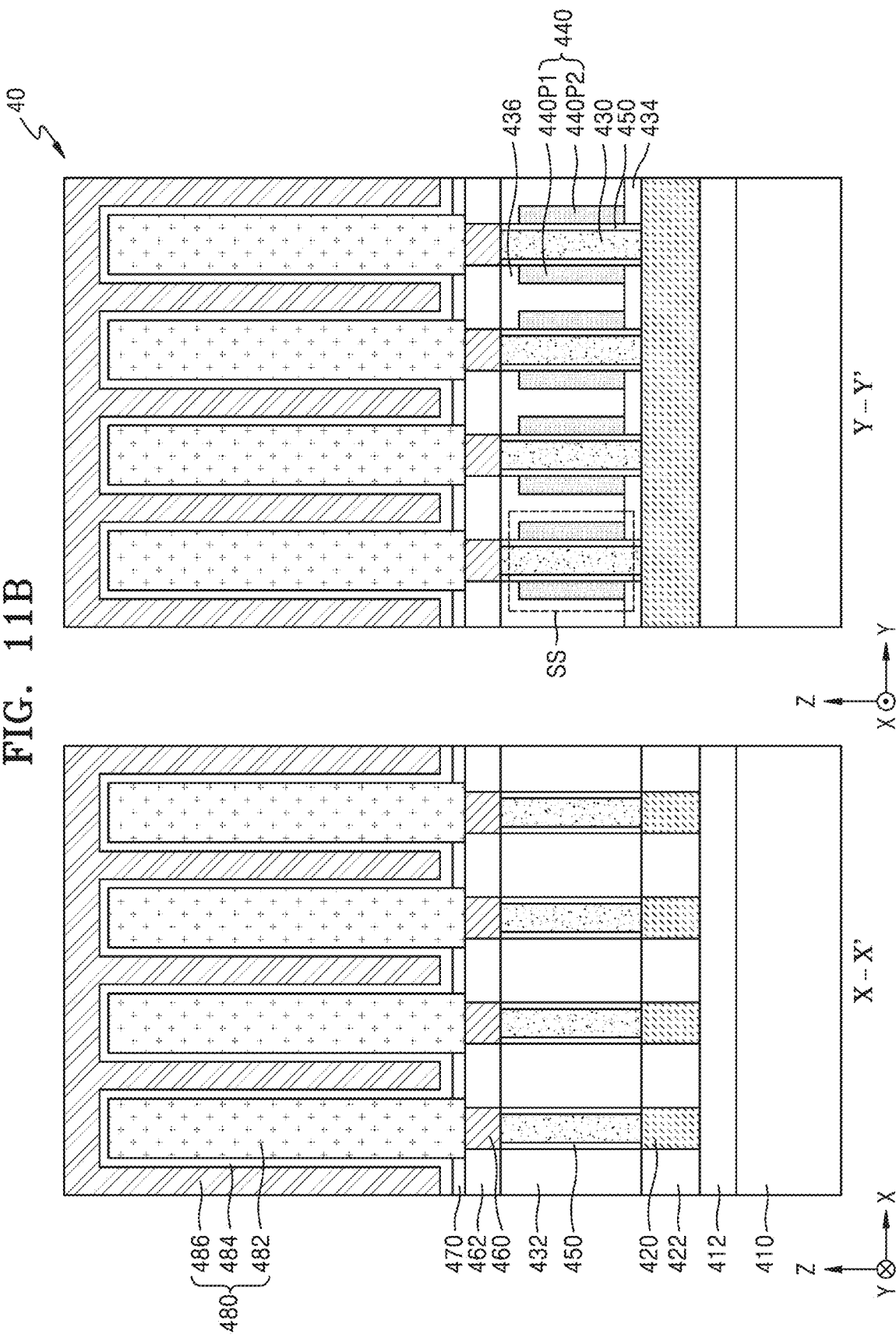
FIG. 11B is a cross-sectional view illustrating together cross-sections taken along lines X-X' and Y-Y' of FIG. 11A.
Figure 11C:
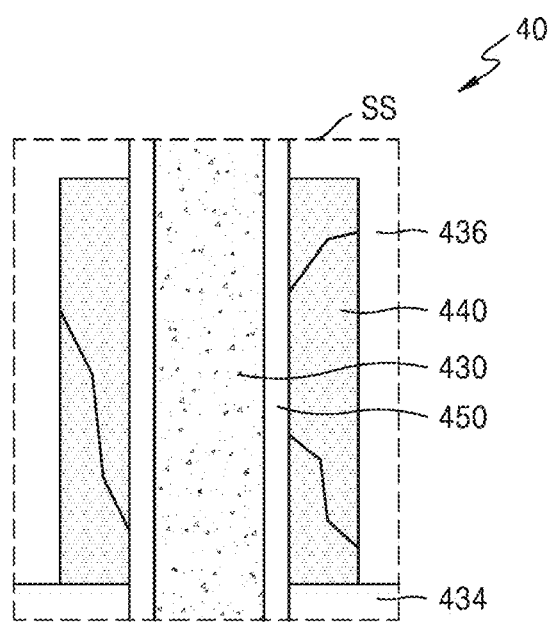
FIG. 11C is an enlarged cross-sectional view illustrating a region SS of FIG. 11B.

FIG. 11A is a layout illustrating an integrated circuit device according to some example embodiments of inventive concepts, FIG. 11B is a cross-sectional view illustrating together cross-sections taken along lines X-X' and Y-Y' of FIG. 11A, and FIG. 11C is an enlarged cross-sectional view illustrating a region SS of FIG. 11B.

Referring to FIGS. 11A to 11C, an integrated circuit device 40 includes a substrate 410, a plurality of first conductive lines 420, a channel layer 430, a gate electrode 440, and a gate insulating layer 450, and a capacitor structure 480.

The integrated circuit device 40 may include a memory device including a vertical channel transistor (VCT). The VCT may refer to a structure in which a channel length of the channel layer 430 extends in a vertical direction from the substrate 410.

A lower insulating layer 412 may be on the substrate 410, and a plurality of first conductive lines 420 may be on the lower insulating layer 412 to be spaced apart from each other in the first horizontal direction (X direction) and to extend in the second horizontal direction (Y direction). A plurality of first insulation patterns 422 may be on the lower insulating layer 412 to fill a space between the plurality of first conductive lines 420. The plurality of first insulation patterns 422 may extend in the second horizontal direction (Y direction), and an upper surface of the plurality of first insulation patterns 422 may be at the same level as an upper surface of the plurality of first conductive lines 420. The plurality of first conductive lines 420 may function as bit lines of the integrated circuit device 40; however, example embodiments are not limited thereto.

In some example embodiments, the plurality of first conductive lines 420 may include doped polysilicon, a metal, a conductive metal nitride, a conductive metal silicide, a conductive metal oxide, or a combination thereof. For example, the plurality of first conductive lines 420 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but example embodiments are not limited thereto. The plurality of first conductive lines 420 may include a single layer or multiple layers of the above-described materials. In some example embodiments, the plurality of first conductive lines 420 may include a two-dimensional (2D) semiconductor material, and for example, the 2D semiconductor material may include graphene, carbon nanotube, or a combination thereof.

Channel layers 430 may be arranged in a matrix in which the channel layers 430 are arranged on the plurality of first conductive lines 420 to be spaced apart from each other in the first horizontal direction (X direction) and the second horizontal direction (Y direction). The channel layer 430 may have a first width in the first horizontal direction (X direction) and have a first height in a vertical direction (Z direction), and the first height may be greater than the first width. For example, the first height may be about 2 times to about 10 times the first width but is not limited thereto. A bottom portion of the channel layer 430 may function as a first source/drain region (not illustrated), an upper portion of the channel layer 430 may function as a second source/drain region (not illustrated), and a portion of the channel layer 430 between first and second source/drain regions may function as a channel region (not illustrated).

In some example embodiments, the channel layer 430 may include an oxide semiconductor, for example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof. The channel layer 430 may include a single layer or layers of the oxide semiconductor. In some examples embodiments the channel layer 430 may have a bandgap energy that is greater than a bandgap energy of silicon. For example, the channel layer 430 may have a bandgap energy of about 1.5 eV to about 5.6 eV. For example, the channel layer 430 may have the best channel performance when having a bandgap energy of about 2.0 eV to about 4.0 eV. For example, the channel layer 430 may be polycrystalline or amorphous but is not limited thereto. In some example embodiments, the channel layer 430 may include a 2D semiconductor material, and for example, the 2D semiconductor material may include graphene, carbon nanotubes, or a combination thereof.

The gate electrode 440 may extend in the first horizontal direction (X direction) on both sidewalls of the channel layer 430. The gate electrode 440 may include a first sub-gate electrode 440P1 facing a first sidewall of the channel layer 430 and a second sub-gate electrode 440P2 facing a second sidewall opposite to the first sidewall of the channel layer 430. Because one channel layer 430 is between the first sub-gate electrode 440P1 and the second sub-gate electrode 440P2, the integrated circuit device 40 may have a dual-gate transistor structure. However, inventive concepts are not limited thereto, and a single gate transistor structure may also be implemented by omitting the second sub-gate electrode 440P2 and by forming only the first sub-gate electrode 440P1 facing the first sidewall of the channel layer 430.

The gate electrode 440 may be formed of a metal, a metal nitride, a metal carbide, or a combination thereof. In some example embodiments, the gate electrode 440 may be formed of Ti, TiN, Ta, TaN, W, WN, TiSiN, WSiN, or a combination thereof. In the integrated circuit device 40 according to inventive concepts, the gate electrode 440 may be formed of a single metal, preferably a single tungsten (W) metal.

When the gate electrode 440 is formed of tungsten (W), crystal grains of tungsten (W) may have a relatively large grain size. The number and/or shapes of the crystal grains illustrated in the drawings are examples and not limited thereto.

Specifically, diagonal lengths of crystal grains constituting the gate electrode 440 may be in a range of about 80 nm to about 100 nm but are not limited thereto. Alternatively or additionally, each of the crystal grains may be configured to have a superlattice structure.

In order for each crystal grain to be formed in a size that is greater than or equal to a desired grain size, a fabrication facility (for example, a chemical vapor deposition facility) capable of forming a thin film with tungsten (W) may perform a process with a recipe similar to, e.g. substantially the same as, the recipe described with reference to FIGS. 1A to 1D.

The gate insulating layer 450 may surround a sidewall of the channel layer 430 and may be between the channel layer 430 and the gate electrode 440. For example, the entire sidewall of the channel layer 430 may be surrounded by the gate insulating layer 450, and part of the sidewall of the gate electrode 440 may be in contact with the gate insulating layer 450. In other embodiments, the gate insulating layer 450 may extend in an extension direction (that is, the first horizontal direction (X direction)) of the gate electrode 440, and among sidewalls of the channel layer 430, only two sidewalls facing the gate electrode 440 may also be in contact with the gate insulating layer 450.

In some example embodiments, the gate insulating layer 450 may include a silicon oxide film, a silicon oxynitride film, a high-k dielectric layer with a higher dielectric constant than a dielectric constant of the silicon oxide film, or a combination thereof. The high-k dielectric layer may be formed of a metal oxide or a metal oxynitride. For example, the high-k dielectric layer capable of being used as the gate insulating layer 450 may be formed of $HfO_2$, HfSiO, HfSiON, HfTaO, HfTiO, HfZrO, $ZrO_2$, $Al_2O_3$, or a combination thereof but is not limited thereto.

A plurality of second insulation patterns 432 may extend in the second horizontal direction (Y direction) on the plurality of first insulation patterns 422, and the channel layer 430 may be between two adjacent second insulation patterns 432 of the plurality of second insulation patterns 432. In addition, a first buried layer 434 and a second buried layer 436 may be in a space between two adjacent channel layers 430, between two adjacent second insulation patterns 432. The first buried layer 434 may be at a bottom portion of the space between two adjacent channel layers 430, and the second buried layer 436 may be on the first buried layer 434 to fill the rest of the space between the two adjacent channel layers 430. A top surface of the second buried layer 436 may be at the same level as a top surface of the channel layer 430, and the second buried layer 436 may cover the top surface of the gate electrode 440. Alternatively or additionally, the plurality of second insulation patterns 432 may also be formed as material layers continuous to the plurality of first insulation patterns 422, or the second buried layer 436 may also be formed as a continuous material layer to the first buried layer 434.

Structures such as capacitor contacts 460 may be on the channel layers 430. The capacitor contacts 460 may vertically overlap with the channel layers 430 and may be arranged in a matrix in which the capacitor contacts 460 are spaced apart from each other in the first horizontal direction (X direction) and the second horizontal direction (Y direction). The capacitor contacts 460 may each be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof but are not limited thereto. The upper insulating layer 462 may surround sidewalls of the capacitor contact 460 on the plurality of second insulation patterns 432 and the second buried layer 436.

An etch stop layer 470 may be on the upper insulating layer 462, and the capacitor structure 480 may be on the etch stop layer 470. The capacitor structure 480 may include a lower electrode 482, a capacitor dielectric layer 484, and an upper electrode 486.

The lower electrode 482 may pass through the etch stop layer 470 to be electrically connected to an upper surface of the capacitor contact 460. The lower electrode 482 may be formed in a pillar type extending in the vertical direction (Z direction) but is not limited thereto. In some example embodiments, the lower electrode 482 may be arranged to vertically overlap the capacitor contact 460 and may be arranged in a matrix in which the lower electrodes are spaced apart from each other in the first horizontal direction (X direction) and the second horizontal direction (Y direction). In addition, a landing pad (not illustrated) may also be between the capacitor contact 460 and the lower electrode 482 such that the lower electrode 482 may have a hexagonal shape.

Figure 12A:
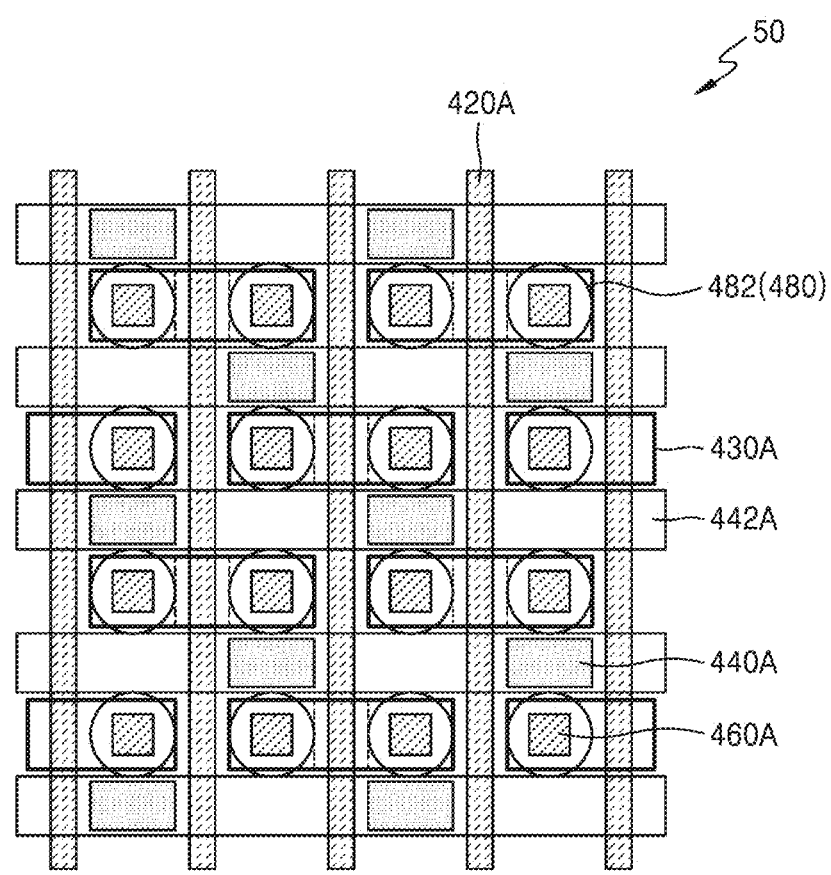
FIG. 12A is a layout illustrating an integrated circuit device according to some example embodiments of inventive concepts.
Figure 12B:
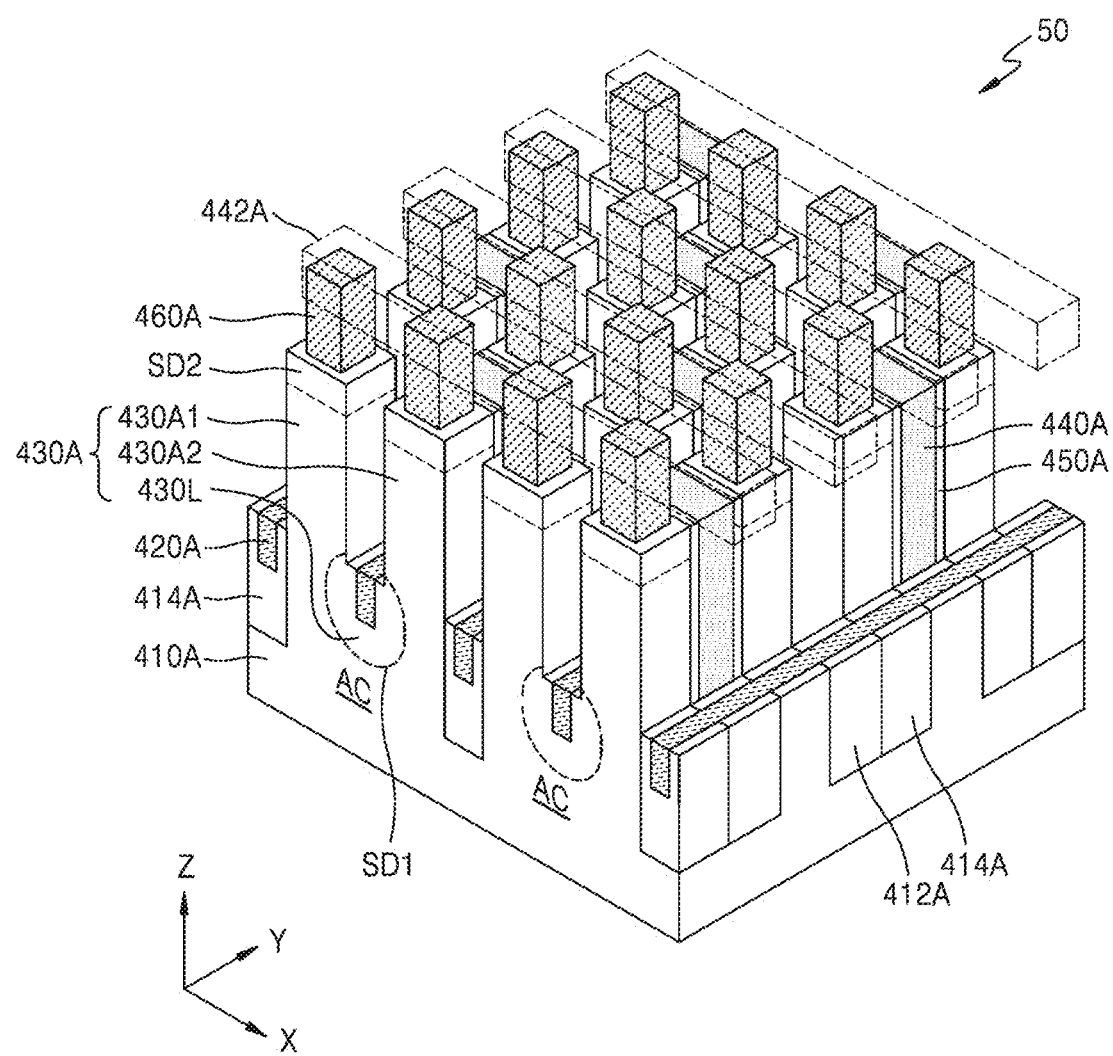
FIG. 12B is a perspective view illustrating the integrated circuit device of FIG. 12A.

FIG. 12A is a layout illustrating an integrated circuit device according to some example embodiments of inventive concepts, and FIG. 12B is a perspective view illustrating the integrated circuit device of FIG. 12A.

Referring to FIGS. 12A and 12B together, an integrated circuit device 50 may include a substrate 410A, a plurality of first conductive lines 420A, a channel structure 430A, a contact gate electrode 440A, a plurality of second conductive lines 442A, and a capacitor structure 480.

The integrated circuit device 50 may be or include a memory device including a VCT.

A plurality of active regions AC may be defined in the substrate 410A by the first device isolation layer 412A and the second device isolation layer 414A. The channel structure 430A may be in each of the active regions AC, and the channel structure 430A may include a first active pillar 430A1 and a second active pillar 430A2 respectively extending in a vertical direction, and a connection portion 430L connected to a bottom of the active pillar 430A1 and a bottom of the second active pillar 430A2. A first source/drain region SD1 may be in the connection portion 430L, and second source/drain regions SD2 may be formed above the first and second active pillars 430A1 and 230A2. The first and second active pillars 430A1 and 430A2 may each constitute an independent unit memory cell.

The plurality of first conductive lines 420A may extend in a direction crossing each of the plurality of active regions AC, for example, in the second horizontal direction (Y direction). One of the plurality of first conductive lines 420A may be on the connection portion 430L between the first and second active pillars 430A1 and 430A2, and the one first conductive line 420A may be on the first source/drain region SD1. Another first conductive line 420A adjacent to the one first conductive line 420A may be between the two channel structures 430A. One of the plurality of first conductive lines 420A may function as a common bit line included in two unit memory cells constituting the first and second active pillars 430A1 and 430A2 arranged on both sides of the one first conductive line 420A.

One contact gate electrode 440A may be between two adjacent channel structures 430A in the second horizontal direction (Y direction). For example, the contact gate electrode 440A may be between the first active pillar 430A1 included in one channel structure 430A and the second active pillar 430A2 of the channel structure 430A adjacent thereto, and one contact gate electrode 440A may be shared by the first and second active pillars 430A1 and 430A2 arranged on both the sidewalls of the contact gate electrode 440A. A gate insulating layer 450A may be between the contact gate electrode 440A and the first active pillar 430A1 and between the contact gate electrode 440A and the second active pillar 430A2. The plurality of second conductive lines 442A may extend in the first horizontal direction (X direction) on an upper surface of the contact gate electrode 440A. The plurality of second conductive lines 442A may function as word lines of the integrated circuit device 50.

The contact gate electrode 440A may be formed of, include, consist of, or consist essentially of a metal, a metal nitride, a metal carbide, or a combination thereof. In some embodiments, the contact gate electrode 440A may be formed of Ti, TiN, Ta, TaN, W, WN, TiSiN, WSiN, or a combination thereof. In the integrated circuit device 40 according to inventive concepts, the contact gate electrode 440A may be formed of a single metal, preferably, a single tungsten (W) metal.

When the contact gate electrode 440A is formed of tungsten (W), crystal grains of tungsten (W) may have a relatively large grain size. The number and shapes of the crystal grains illustrated in the drawings are examples and not limited thereto.

Specifically, diagonal lengths of crystal grains constituting the contact gate electrode 440A may be in a range of about 80 nm to about 100 nm but are not limited thereto. Alternatively or additionally, each of the crystal grains may be configured to have a superlattice structure.

In order for each of crystal grains to be formed in a size that is greater than or equal to a desired grain size, a fabrication facility (for example, a chemical vapor deposition facility) capable of forming a thin film of tungsten (W) may perform a process with substantially the same recipe as the recipe described with reference to FIGS. 1A to 1D.

A capacitor contact 460A may be on the channel structure 430A. The capacitor contact 460A may be on the second source/drain region SD2, and the capacitor structure 480 may be on the capacitor contact 460A.

While inventive concepts has been particularly shown and described with reference to some example embodiments thereof, it will be understood that various changes in form and details may be made therein without departing from the spirit and scope of the following claims. Furthermore none of the example embodiments are necessarily mutually exclusive with one another. For example some example embodiments may include features described with reference to one or more figures, and may also include features described with reference to one or more other figures.

What is claimed is:
1. An integrated circuit device comprising:
a substrate including an active region defined by a device isolation layer, the substrate defining a gate trench extending across the active region;
a gate dielectric layer conformally covering an inner surface of the gate trench; and
a gate electrode filling the gate trench on the gate dielectric layer,
wherein the gate electrode is composed of crystal grains of a single metal, and
a diagonal length of at least one of the crystal grains is greater than a height of the active region that is in contact with the gate electrode.
2. The integrated circuit device of claim 1, wherein
the single metal is tungsten (W), and
diagonal lengths of each of the crystal grains are about 80 nm to about 100 nm.

3. The integrated circuit device of claim 2, wherein each of the crystal grains has a superlattice structure.

4. The integrated circuit device of claim 2, wherein the gate electrode that is on the active region has seven or fewer grains of tungsten.

5. The integrated circuit device of claim 1, wherein diagonal lengths of each of the crystal grains are greater than a horizontal width of a top surface of the active region that is on the gate electrode.

6. The integrated circuit device of claim 1, further comprising:
a gate barrier layer between the gate dielectric layer and the gate electrode, the gate barrier layer including a metal nitride.

7. The integrated circuit device of claim 1, wherein the gate dielectric layer and the gate electrode correspond to a word line buried in the substrate, and the integrated circuit device further comprises a capping insulation layer filling the gate trench above the gate dielectric layer and the gate electrode.

8. The integrated circuit device of claim 7, wherein the active region has a fin shape under the buried word line.

9. A method of forming the integrated circuit device of claim 1, comprising:
forming the single metal with a tungsten forming process using a source gas, the source gas including at least one of borane ($BH_3$), diborane ($B_2H_6$), monosilane ($SiH_4$), and tungsten hexafluoride ($WF_6$).

10. The method of claim 9, wherein the tungsten forming process comprises: a nucleation layer forming process performed at a process temperature of about 250° C. or less; and a bulk layer forming process performed at a process temperature of about 300° C. or less.

11. An integrated circuit device comprising:
a substrate including an active region defined by a device isolation layer, the substrate defining a gate trench extending across the active region;
a gate dielectric layer conformally covering an inner surface of the gate trench; and
a gate electrode filling the gate trench on the gate dielectric layer,
wherein the gate electrode is composed of crystal grains of a single metal, and
the gate electrode comprises first crystal grains filling the gate trench, and second crystal grains between the first crystal grains and the gate dielectric layer, at least one of the second crystal grains smaller in grain size than at least one of the first crystal grains,
a diagonal length of at least one of the first crystal grains is greater than a horizontal width of a top surface of the active region.

12. The integrated circuit device of claim 11, wherein the single metal is tungsten (W),
the at least one of the first crystal grains has diagonal lengths of about 80 nm to about 100 nm, and
a diagonal length of the at least one of the second crystal grains is about 20 nm or less.

13. The integrated circuit device of claim 11, wherein the diagonal length of at least one of the first crystal grains is greater than a height of the active region on the gate electrode.

14. The integrated circuit device of claim 11, wherein the second crystal grains are in a bottom portion of the gate trench.

15. The integrated circuit device of claim 11, further comprising:
a gate barrier layer between the gate dielectric layer and the second crystal grains and between the gate dielectric layer and the first crystal grains, the gate barrier layer including a metal nitride.

16. An integrated circuit device comprising:
a substrate including an active region defined by a device isolation layer;
a gate structure crossing the active region and buried in the substrate; and
source/drain regions on both sides of the gate structure,
wherein the gate structure is defined by a gate trench in the substrate, the gate structure including a gate dielectric layer conformal on an inner wall of the gate trench, a gate barrier layer conformal on the gate dielectric layer in a lower region of the gate trench, a gate electrode on the gate barrier layer and filling the lower region of the gate trench, and a capping insulation layer on the gate electrode to fill an upper region of the gate trench,
the gate electrode is composed of crystal grains of a single metal,
the gate electrode comprises first crystal grains filling the gate trench, and second crystal grains between the first crystal grains and the gate dielectric layer, at least one of the second crystal grains having a diagonal length less than a diagonal length of at least one of the first crystal grains, and
the diagonal length of the at least one of the first crystal grains is greater than a height of a top surface of the active region exposed from the device isolation layer and a horizontal width of the top surface of the active region exposed from the device isolation layer.

17. The integrated circuit device of claim 16, wherein the single metal is tungsten (W),
at least one of the first crystal grains has diagonal lengths of about 80 nm to about 100 nm, and
at least one of the second crystal grains has a diagonal length of about 20 nm or less.

18. A method of forming the integrated circuit device of claim 17, comprising:
forming the tungsten using a nucleation layer forming process performed at a process temperature of about 250° C. or less by using a source gas including at least one of borane ($BH_3$), diborane ($B_2H_6$), monosilane ($SiH_4$), and tungsten hexafluoride ($WF_6$); and
using a bulk layer forming process performed at a process temperature of about 300° C. or less.

19. The integrated circuit device of claim 16, wherein each of the first and second crystal grains has a superlattice structure.

20. The integrated circuit device of claim 16, wherein the active region has a saddle fin shape under the gate structure.

* * * * *